(12) United States Patent
Ozawa et al.

(10) Patent No.: US 6,191,630 B1
(45) Date of Patent: Feb. 20, 2001

(54) DELAY CIRCUIT AND OSCILLATOR CIRCUIT USING SAME

(75) Inventors: Seiichi Ozawa; Daisuke Yamazaki, both of Kawasaki (JP)

(73) Assignee: Fujitsu Limited, Kawasaki (JP)

( * ) Notice: Under 35 U.S.C. 154(b), the term of this patent shall be extended for 0 days.

(21) Appl. No.: 09/184,543

(22) Filed: Nov. 2, 1998

(30) Foreign Application Priority Data

Jun. 18, 1998 (JP) ................................................. 10-171407

(51) Int. Cl.⁷ .................................................. H03H 11/26
(52) U.S. Cl. .......................... 327/278; 327/281; 327/277; 327/264; 327/172; 331/57
(58) Field of Search .................... 327/276, 278, 327/277, 281, 172, 134, 264, 268; 331/57

(56) References Cited

U.S. PATENT DOCUMENTS

| | | | | |
|---|---|---|---|---|
| 4,244,043 | * | 1/1981 | Fujita | 368/85 |
| 4,912,433 | * | 3/1990 | Motegi | 331/8 |
| 5,479,129 | * | 12/1995 | Fernandez | 327/276 |
| 5,898,242 | * | 4/1999 | Peterson | 327/278 |
| 5,929,656 | * | 7/1999 | Pagones | 326/83 |

FOREIGN PATENT DOCUMENTS 6-112781   4/1992   (JP) .

* cited by examiner

*Primary Examiner*—Margaret R. Wambach
*Assistant Examiner*—Cassandra Cox
(74) *Attorney, Agent, or Firm*—Helfgott & Karas, P.C.

(57) ABSTRACT

Disclosed is a delay circuit for delaying at least the timing of a rising edge or the timing of a falling edge of an input signal alternating between first and second levels. The delay circuit includes (1) a charge pump in which first and second field-effect transistors of different channels are serially connected; (2) a capacitor connected in parallel with the first field-effect transistor; (3) a charging current control circuit for passing a charging current into the capacitor via the second field-effect transistor of the charge pump when the input signal is at the first level; (4) a discharge current control circuit for releasing a discharge current from the capacitor via the first field-effect transistor when the input signal is at the second level; and (5) a discrimination circuit for outputting a signal of a prescribed logic level based upon a terminal voltage of the capacitor. The values of the charging current and discharge current of the capacitor are controlled to control the slope of the input voltage to the discrimination circuit, thereby adjusting the delay time.

18 Claims, 22 Drawing Sheets

DELAY CIRCUIT AND OSCILLATOR CIRCUIT USING SAME

BACKGROUND OF THE INVENTION

This invention relates to a delay circuit and to an oscillator circuit using the same. More particularly, the invention relates to a CMOS-implemented delay circuit with a variable delay time used in phase adjustment or the like, as well as to an oscillator circuit that uses this delay circuit.

CMOS delay circuits have long been in use as delay circuits for subjecting an input signal pulse to a predetermined time delay. FIG. 22 is a diagram illustrating such a CMOS delay circuit according to the prior art. The delay circuit includes a P-MOS transistor (a P-channel field-effect transistor) 101 for supplying a charging current and having a gate terminal to which a charging control voltage 109 is applied; an N-MOS transistor (an N-channel field-effect transistor) 104 for releasing a discharge current and having a gate terminal to which a discharge control voltage 110 is applied; P-MOS and N-MOS transistors 102 and 103 constructing a CMOS inverter and having their gates connected together to provide an input terminal and their drains connected together to provide an output terminal; a charge/discharge capacitor 105 inserted between the CMOS inverter output terminal and ground potential (GND); and a discrimination circuit 106 for discriminating and comparing the capacitor terminal voltage and a predetermined threshold level and outputting a signal having a prescribed logic level in dependence upon the result of the comparison. The discrimination circuit 106 is constituted by a CMOS inverter comprising P-MOS and N-MOS transistors 107 and 108, for example, and outputs a signal that is the result of inverting the terminal voltage level of the capacitor 105.

The CMOS delay circuit of FIG. 22 smoothens an input signal by the inverter circuitry, which comprises the P-MOS transistors 101, 102 and N-MOS transistors 103, 104, and the capacitor 105, and inverts the smoothened waveform by the discrimination circuit (inverter circuit) 106 comprising the P-MOS transistor 107 and N-MOS transistor 108, thereby providing a delay.

Consider an ideal case in which the P-MOS transistor 101 and N-MOS transistor 104 are completely devoid of parasitic capacitance. FIG. 23A is a diagram useful in describing such an ideal case in which there is no parasitic capacitance. When the input signal is at ground level, the capacitor 105 is charged up to the power-supply level, the input to the discrimination circuit 106 is the power-supply level and the output thereof is the ground level. If the input signal rises to the power-supply level from the ground level under these conditions, the P-MOS transistor 102 turns off, the N-MOS transistor 103 turns on and the electric charge that has accumulated in the capacitor 105 is discharged through the N-MOS transistor 104. Since the N-MOS transistor 104 acts as a current source controlled by the discharge control voltage 110, the discharge current is rendered constant. Accordingly, the input voltage of the discrimination circuit 106 falls from the power-supply level to the ground level at a fixed slope controlled by the discharge control voltage 110. The discrimination circuit 106 discriminates and outputs the input voltage at the threshold voltage value Vth. When the input voltage of the discrimination circuit 106 becomes Vth, therefore, the output signal level rises from the ground level to the power-supply level.

As a result of the foregoing, a delay time $\tau_1$ from the rising edge of the input signal to the rising edge of the output signal can be controlled through the slope of the input voltage of discrimination circuit 106 by the discharge control voltage 110. Similarly, a delay time $\tau_2$ when the input signal decays can be controlled by the charging control voltage 109.

In order for the delay circuit to operate stably, it is required that the input voltage to the discrimination circuit 106 makes a complete swing from the power-supply level to the ground level or from the ground level to the power-supply level in one period. In order for the input voltage to swing completely, the range over which delay time can be varied is limited because the slope of the input voltage to the discrimination circuit 106 is limited. In a case where the threshold voltage value Vth is one-half the power-supply voltage, the range over which the delay time can be varied is half the period T. FIGS. 24A, 24B are diagrams useful in describing the reason why the input to the discrimination circuit 106 must make a complete swing. FIG. 24A illustrates a case where the input swings completely from the power-supply level to the ground level, and FIG. 24B illustrates a case where the input does not swing completely from the power-supply level to the ground level. In the case of the full swing shown in FIG. 24A, a delay time $\tau$ is constant, i.e., is independent of the pattern of the input signal, and operation is stable. When the input to the discrimination circuit 106 does not make a full swing, however, as shown in FIG. 24B, the voltage at the beginning of the slope differs depending upon the input signal pattern and therefore the delay time $\tau$ fluctuates (see $\tau'$, $\tau''$) depending upon the input signal and operation becomes unstable.

The foregoing relates to the ideal case in which the MOS transistors 101, 104 are devoid of parasitic capacitance. In actuality, however, parasitic capacitances 111, 114 exist and cause the circuit to behave in a manner different from that of the ideal case. FIG. 23B is a diagram useful in describing operation when the parasitic capacitances 111, 114 exist.

When the input signal is at ground level, the capacitor 105 is charged up to the power-supply level and the input to the discrimination circuit 106 is the power-supply level. Further, the N-MOS transistor 104 is ON at all times. As a consequence, the parasitic capacitance 114 is discharged to the ground level. If the input signal rises under these conditions, the P-MOS transistor 102 turns off and the N-MOS transistor 103 turns on. As a result, the capacitor 105 and the parasitic capacitance 114 are connected in series and, hence, the input to the discrimination circuit 106 falls instantaneously to a voltage V1 intermediate the power-supply level and the ground level until the parasitic capacitance 114 is charged. Accordingly, the input voltage to the discrimination circuit 106 subsequently starts falling from the intermediate voltage V1 at a fixed slope controlled by the discharge control voltage 110. Since the voltage V1 is near the threshold voltage value Vth of the discrimination circuit 106, the range over which the delay time can be varied cannot be enlarged.

Similarly, in a case where the input signal decays, the input voltage to the discrimination circuit 106 rises instantaneously to an intermediate voltage V2 and then rises from the intermediate voltage V2 at a fixed slope. As a consequence, the range over which the delay time is variable cannot be enlarged.

Thus, owing to the influence of the parasitic capacitances 111, 114, the input voltage to the discrimination circuit 106 changes instantaneously to the intermediate voltages V1, V2 when the level of the input signal changes over, as a result of which it is not possible to enlarge the range over which delay time can be varied.

Further, since the intermediate voltages V1, V2 vary depending upon the parasitic capacitances 111, 114, there is a great variance in delay time as caused by conditions at the time of manufacture, environmental temperature, etc.

With the conventional delay circuit, therefore, it is not possible to enlarge the range over which delay time can be varied because of the influence of the parasitic capacitance of field-effect transistors.

Further, with the conventional delay circuit, there is a great variance in delay time as caused by conditions at the time of manufacture, environmental temperature, etc.

SUMMARY OF THE INVENTION

Accordingly, an object of the present invention is to provide a delay circuit that is free of the influence of parasitic capacitance in transistors, thereby making it possible to enlarge the range of delay time variability and reduce variance in delay time.

Another object of the present invention is to provide a variety of delay circuits such as a delay circuit in which the pulse width of the output signal is not different from the pulse width of the input signal, a delay circuit for delaying only the rising edge of the input signal, a delay circuit for delaying only the falling edge of the input signal, a delay circuit in which input and output levels are the inverse of each other and a delay circuit in which the input and output levels are not the inverse of each other.

Another object of the present invention is to provide a VCO (Voltage-Controlled Oscillator) circuit that uses delay circuits having good controllability and a large range over which frequency can be varied.

In accordance with the present invention, the foregoing objects are attained by providing a delay circuit having (1) an inverter in which field-effect transistors of different channels are serially connected, a connection between the transistors is adopted as an output terminal of the inverter and input signals are applied to gates of the field-effect transistors; (2) a capacitor connected to the output terminal of the inverter; (3) a discrimination circuit for discriminating a signal at the output terminal of the inverter; (4) a charging current control circuit connected to the gate of one of the field-effect transistors for controlling, on the basis of an input signal and a control signal, a charging current that flows into the capacitor; and (5) a discharge current control circuit connected to the gate of the other of the field-effect transistors for releasing a discharge current from the capacitor on the basis of the input signal and a control signal.

Further, in accordance with the present invention, the foregoing objects are attained by providing a delay circuit for delaying at least one of a timing of a rising edge and a timing of a falling edge of an input signal alternating between first and second levels, comprising (1) a charge pump in which two field-effect transistors of different channels are serially connected; (2) a capacitor connected in parallel with one (i.e., a first) of the field-effect transistors; (3) a charging current control circuit for passing a charging current into the capacitor via the other (i.e., a second) of the field-effect transistors of the charge pump when the input signal is at the first level; (4) a discharge current control circuit for releasing a discharge current from the capacitor via the first field-effect transistor when the input signal is at the second level; and (5) a discrimination circuit for outputting a signal of a prescribed logic level based upon a terminal voltage of the capacitor.

Further, in accordance with the present invention, the foregoing objects are attained by providing an oscillator circuit constituted by delay circuits, in which levels of input and output signals are in inverse relation to each other, connected serially into a ring of an odd number of stages, each delay circuit having (1) a charge pump, (2) a capacitor, (3) a charging current control circuit for passing a current into the capacitor, (4) a discharge current control circuit for releasing a discharge current from the capacitor, and (5) a discrimination circuit for outputting a signal of a prescribed logic level based upon a terminal voltage of the capacitor.

Further, in accordance with the present invention, the foregoing objects are attained by providing an oscillator circuit constituted by an even number of delay circuits in which levels of input and output signals are not in inverse relation to each other, the delay circuits being connected serially into a ring with a single signal-level inverting circuit and each delay circuit having (1) a charge pump, (2) a capacitor, (3) a charging current control circuit for passing a current into the capacitor, (4) a discharge current control circuit for releasing a discharge current from the capacitor, and (5) a discrimination circuit for outputting a signal of a prescribed logic level based upon a terminal voltage of the capacitor.

Other features and advantages of the present invention will be apparent from the following description taken in conjunction with the accompanying drawings.

BRIEF DESCRIPTION OF THE DRAWINGS

DESCRIPTION OF THE PREFERRED EMBODIMENTS (A) Overview of the Present Invention

In FIG. 1, a charging current control circuit 1 performs control in such a manner that a charging current flows into a capacitor 5 when an input signal to the circuit is at a first level (e.g., the level of the power supply). A discharge current control circuit 2 performs control in such a manner that a discharge current is released from the capacitor 5 when the input signal is at a second level (e.g., the level of ground). A P-channel field-effect transistor 3 and an N-channel field-effect transistor 4 (e.g., P-MOS and N-MOS transistors, respectively) have their drains connected in series to construct a CMOS charge pump.

Figure 1:
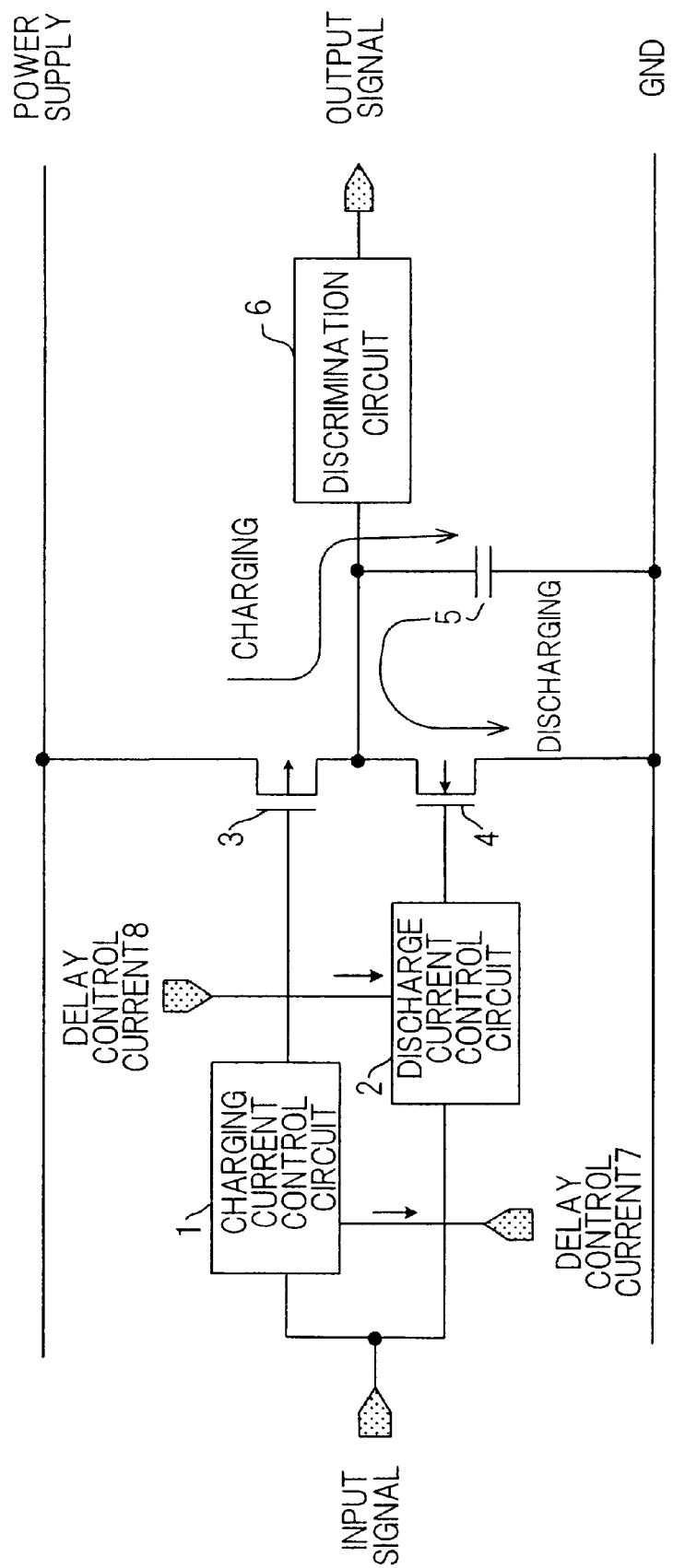
FIG. 1 is a diagram useful in describing an overview of the present invention.

The source of the P-MOS transistor 3 is connected to a power-supply line and its gate terminal is connected to the output of the charging current control circuit 1. The source of the N-MOS transistor 4 is connected to a ground line and its gate terminal is connected to the output of the discharge current control circuit 2. The capacitor 5, which is for charge and discharge, is connected in parallel with the N-MOS transistor 4 across the drain terminal of the charge pump and the ground line. A discrimination circuit 6 determines whether the terminal voltage of the capacitor 5 is equal to or greater than a predetermined threshold level and outputs a signal of a prescribed logic level in dependence upon the determination made.

The P-MOS transistor 3 acts as a charging current source, which is controlled by the charging current control circuit 1, when the input signal is at the power-supply level, and turns off when the input signal is at the ground level. The N-MOS transistor 4, on the other hand, turns off when the input signal is at power-supply level and acts as a discharge current source, which is controlled by the discharge current control circuit 2, when the input signal is at the ground level. The charging current control circuit 1 performs control in such a manner that a charging current proportional to a delay control current 7 flows through the P-MOS transistor 3, and the discharge current control circuit 2 performs control in such a manner that a discharge current proportional to a delay control current 8 flows through the N-MOS transistor 4. Accordingly, the charge and discharge current of the capacitor 5 can be controlled on the basis of the input signal level, the magnitudes of the charging current and discharge current can be controlled, so can the slope of the input voltage of the discrimination circuit 6, and so can the delay time.

In accordance with this arrangement, there is no parasitic capacitance that is connected to the capacitor 5 in series when the input signal changes over between the rising and falling states. When the input signal changes over, therefore, the input voltage to the discrimination circuit 6 does not change instantaneously to an intermediate potential and the input voltage of the discrimination circuit 6 can be controlled at a fixed slope from the ground level to the power-supply level or from the power-supply level to the ground level. Accordingly, the range over which the delay time is variable can be enlarged and a variance in delay time can be reduced.

The discharge current control circuit 2 has a third field-effect transistor (a MOS transistor, which is not shown) for passing a delay control current 8 that conforms to signal delay time. This third MOS transistor and the N-MOS transistor 4 construct a current mirror circuit. When the input signal is at the ground level, the delay control current 8 flows into the third MOS transistor and a discharge current proportional to the delay control current 8 flows into the N-MOS transistor 4 owing to the current mirror function. When the input signal level is at the power-supply level, a delay control current does not flow into the third MOS transistor and the discharge current is made zero. The charging current control circuit 1 has a fourth field-effect transistor (a MOS transistor, which is not shown) for passing a delay control current 7 that conforms to signal delay time. This fourth MOS transistor and the P-MOS transistor 3 construct a current mirror circuit. When the input signal is at the power-supply level, the delay control current 7 flows into the fourth MOS transistor and a charging current proportional to the delay control current 7 flows into the P-MOS transistor 3 owing to the current mirror function. When the input signal level is at the ground level, a delay control current does not flow into the fourth MOS transistor and the charging current is made zero.

The foregoing relates to a case where the circuit outputs a signal obtained by delaying the input signal at both its rising and falling edges. However, it is possible to adopt an arrangement in which the input signal is delayed at only one edge. Further, it is possible to implement a delay circuit in which there is no change in the pulse width of the input and output signals, a delay circuit in which input and output levels inversely related and a delay circuit in which input and output levels are not inversely related.

Further, an oscillator circuit can be constructed by serially connecting, into a ring, an odd number of delay circuits in which the input and output signals are the inverse of each other, or by serially connecting, into a ring, an even number of delay circuits, in which input and output levels are not the inverse of each other, and a single signal-level inverting circuit. Moreover, by controlling the delay time of the delay circuit through control of voltage, oscillation frequency can be controlled and a voltage-controlled oscillator circuit can be constructed.

(B) First Embodiment of CMOS Delay Circuit

Figure 2:
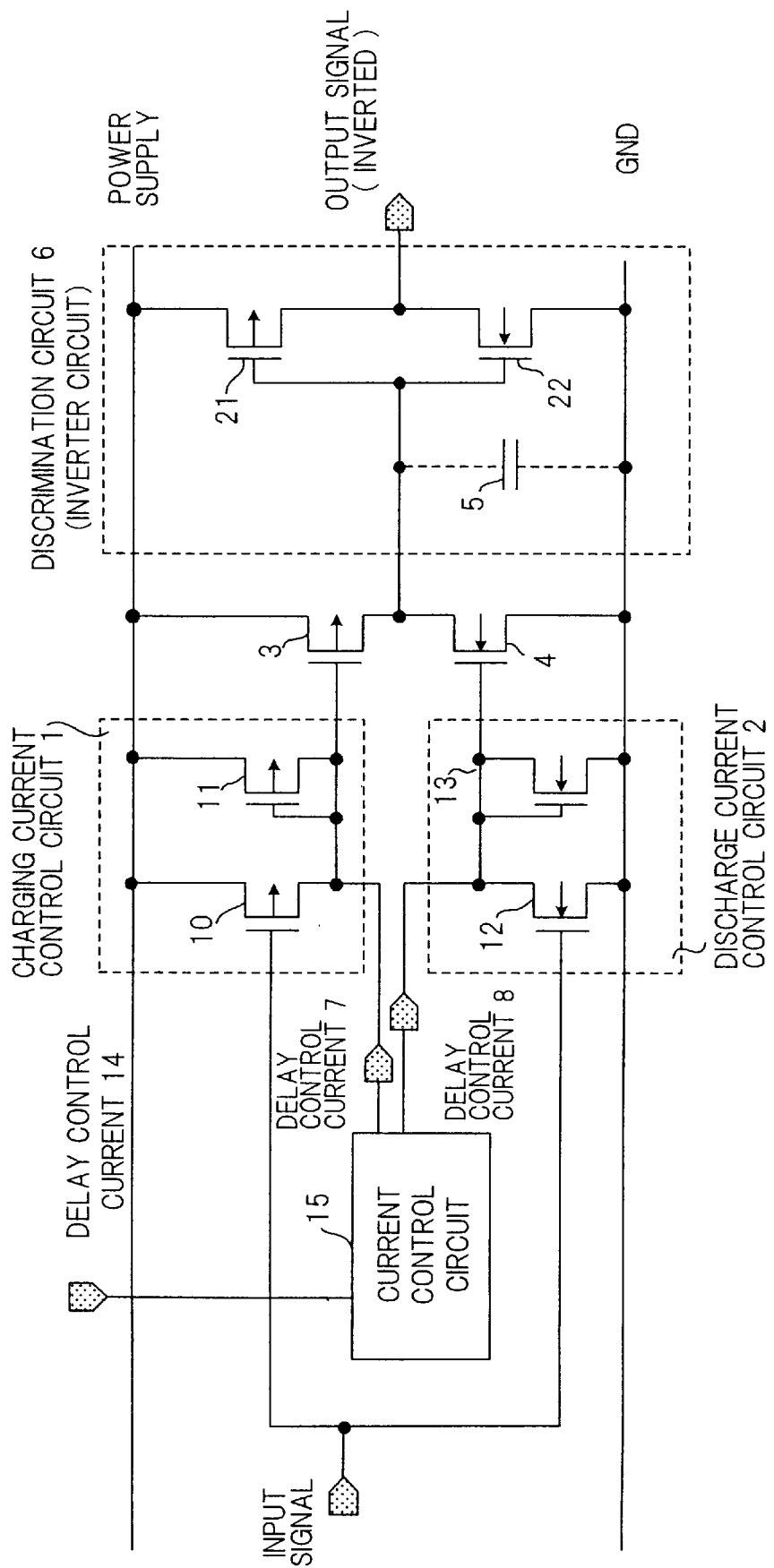
FIG. 2 is a diagram showing a first embodiment of a CMOS delay circuit according to the present invention.

FIG. 2 is a diagram showing the construction of a first embodiment of a CMOS delay circuit according to the present invention.

In FIG. 2, the charging current control circuit 1 performs control in such a manner that a charging current flows into the capacitor 5 when an input signal to the circuit is at the level of the power supply. The discharge current control circuit 2 performs control in such a manner that a discharge current is released from the capacitor 5 when the input signal is at the level of ground. The P-MOS transistor 3 and the N-MOS transistor 4 have their drains connected in series to construct a CMOS charge pump. The source of the P-MOS transistor 3 is connected to the power-supply line and its gate terminal is connected to the charging current control circuit 1. The source of the N-MOS transistor 4 is connected to the ground line and its gate terminal is connected to the discharge current control circuit 2. The capacitor 5, which is for charge and discharge, is connected in parallel with the N-MOS transistor 4 across the drain terminal of the charge pump and the ground line. The discrimination circuit 6 determines whether the terminal voltage of the capacitor 5 is equal to or greater than a predetermined threshold level and outputs a signal of a prescribed logic level in dependence upon the determination made.

A current control circuit 15 performs control in such a manner that a delay control current 7, which conforms to a rising-edge delay time $\tau_H$, flows into the charging current control circuit 1, and in such a manner that a delay control current 8, which conforms to a falling-edge delay time $\tau_T$, flows into the discharge current control circuit 2.

The charging current control circuit 1 is composed of P-MOS transistors 10, 11, and the discharge current control circuit 2 is composed of N-MOS transistors 12, 13. The discrimination circuit 6 is constituted by an inverter circuit comprising a P-MOS transistor 21 and an N-MOS transistor 22, and the input capacitance of the discrimination circuit 6 serves as the capacitor 5.

The P-MOS transistor 10 of the charging current control circuit 1 acts as a switch and is turned off if the input signal is at the power-supply level and is turned on if the input signal is at the ground level. The P-MOS transistor 11 and the P-MOS transistor 3 construct a current mirror circuit. Accordingly, if the input signal is at the power-supply level, the delay control current 7 flows through the P-MOS transistor 11 and not the P-MOS transistor 10. As a result, a current proportional to the delay control current 7 flows into the P-MOS transistor 3 owing to the current mirror function and the P-MOS transistor 3 acts as a current source that introduces charging current. If the input signal is at the ground level, the delay control current 7 flows through the P-MOS transistor 10 and not the PMOS transistor 11. Owing to the current mirror function, therefore, the P-MOS transistor 3 turns off and no charging current flows. In this case a charging current that prevails when the input signal rises from the ground level to the power-supply level can be controlled by the delay control current 7. Consequently, the delay time of the rising edge is controlled by controlling the value of this delay control current.

Similarly, the delay time of the falling edge of the input signal can be controlled by the delay control current 8. That is, an N-MOS transistor 12 of the discharge current control circuit 2 acts as a switch and is turned off if the input signal is at the ground level and turned on if the input signal is at the power-supply level. An N-MOS transistor 13 and the N-MOS transistor 4 construct a current mirror circuit. Accordingly, if the input signal is at the ground level, the delay control current 8 flows through the N-MOS transistor 13 and not the N-MOS transistor 12. As a result, a current proportional to the delay control current 8 flows into the N-MOS transistor 4 owing to the current mirror function and the N-MOS transistor 4 acts as a current source that introduces a discharge current. If the input signal is at the power-supply level, the delay control current 8 flows through the N-MOS transistor 12 and not the M-MOS transistor 13. Owing to the current mirror function, therefore, the N-MOS transistor 4 turns off and no discharge current flows. In this case a discharge current that prevails when the input signal falls from the power-supply level to the ground level can be controlled by the delay control current 8. Consequently, the delay time of the falling edge is controlled by controlling the value of this delay control current.

Figure 3:
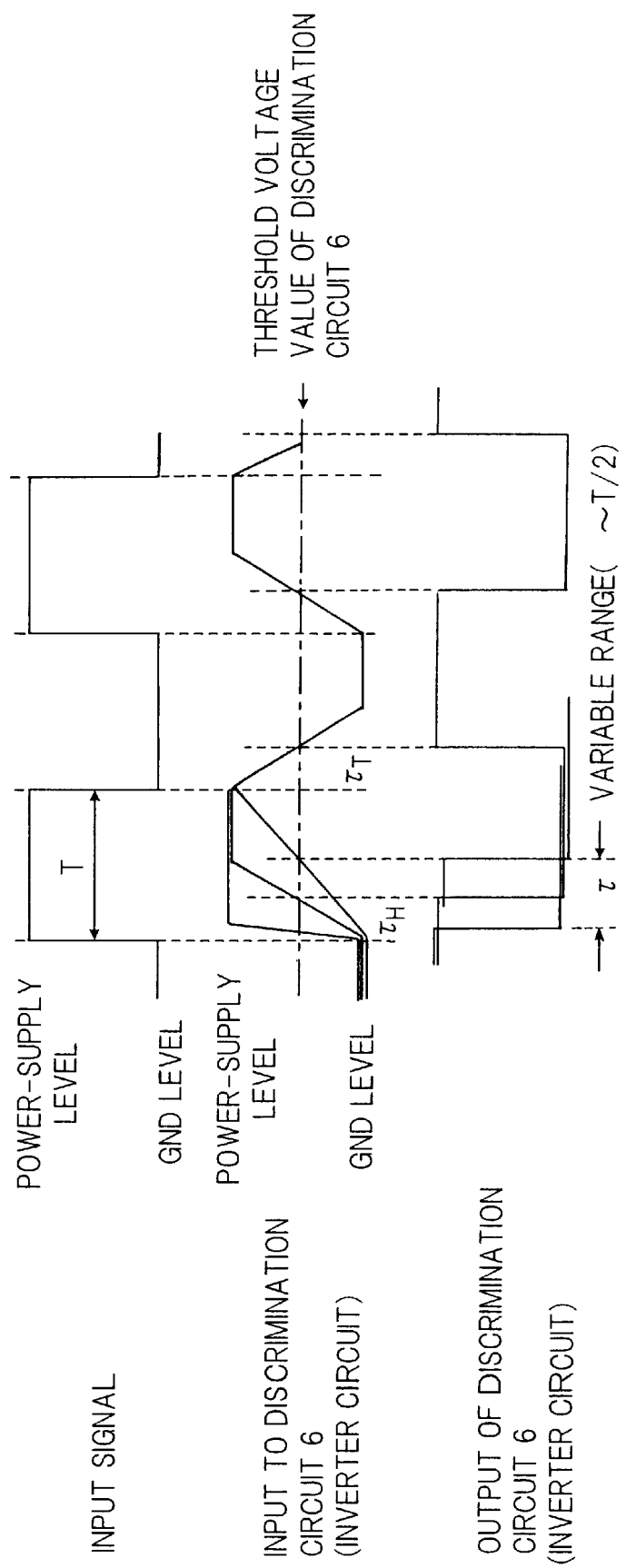
FIG. 3 is a diagram useful in describing the operation of the first embodiment.

As a result of the operation described above, the input voltage of the discrimination circuit 6 can be controlled at a fixed slope from the ground level to the power-supply level and from the power-supply level to the ground level, as shown in FIG. 3. This means that it is possible to obtain a CMOS delay circuit having a broad range $\tau$ over which delay time can be varied and a small variance in terms of delay time.

Further, delay control currents 7, 8 can be varied by the current control circuit 15 while a fixed ratio is maintained between them. As a result, delay time can be controlled by equalizing the delay times $\tau_H$, $\tau_T$ of the rising and falling edges, respectively. If this arrangement is adopted, it is possible to obtain a CMOS delay circuit in which input and output pulse width does not change.

Figure 4:
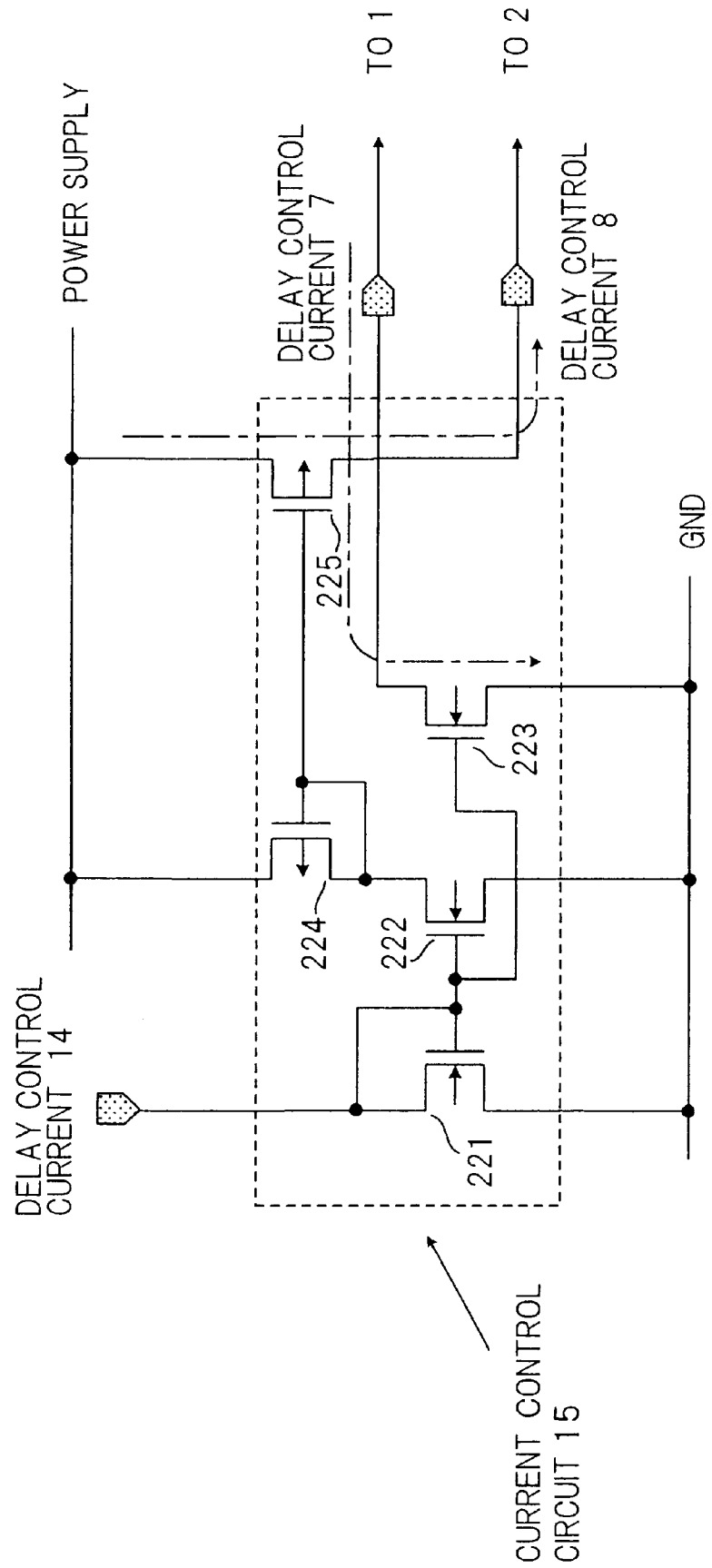
FIG. 4 is a diagram showing an embodiment of a current control circuit according to the present invention.

FIG. 4 shows an embodiment of the current control circuit 15. The current control circuit 15 includes N-MOS transistors 221–223 and P-MOS transistor 224, 225. Three current mirror circuits are constructed by the N-MOS transistor 221 and N-MOS transistor 222, by the N-MOS transistor 221 and N-MOS transistor 223, and by the P-MOS transistor 224 and P-MOS transistor 225. Accordingly, by passing a delay control current 14 into the N-MOS transistor 221, the delay control currents 7, 8, which are proportional to the delay control current 14, can be made to flow into the charging current control circuit 1 and discharge current control circuit 2, respectively, by the current mirror function.

(C) Second Embodiment of CMOS Delay Circuit

Figure 5:
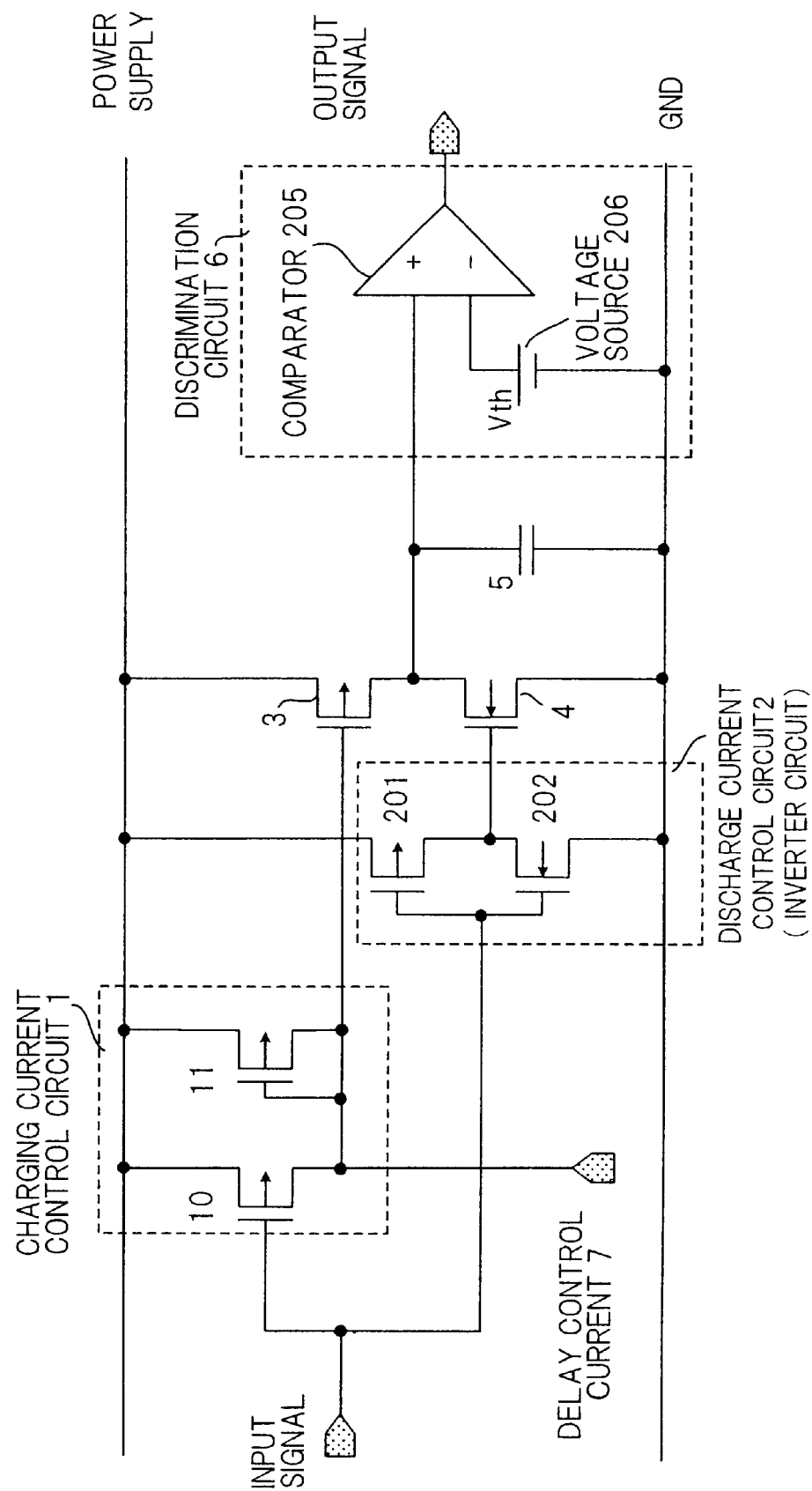
FIG. 5 is a diagram showing a second embodiment of a CMOS delay circuit according to the present invention.
Figure 6:
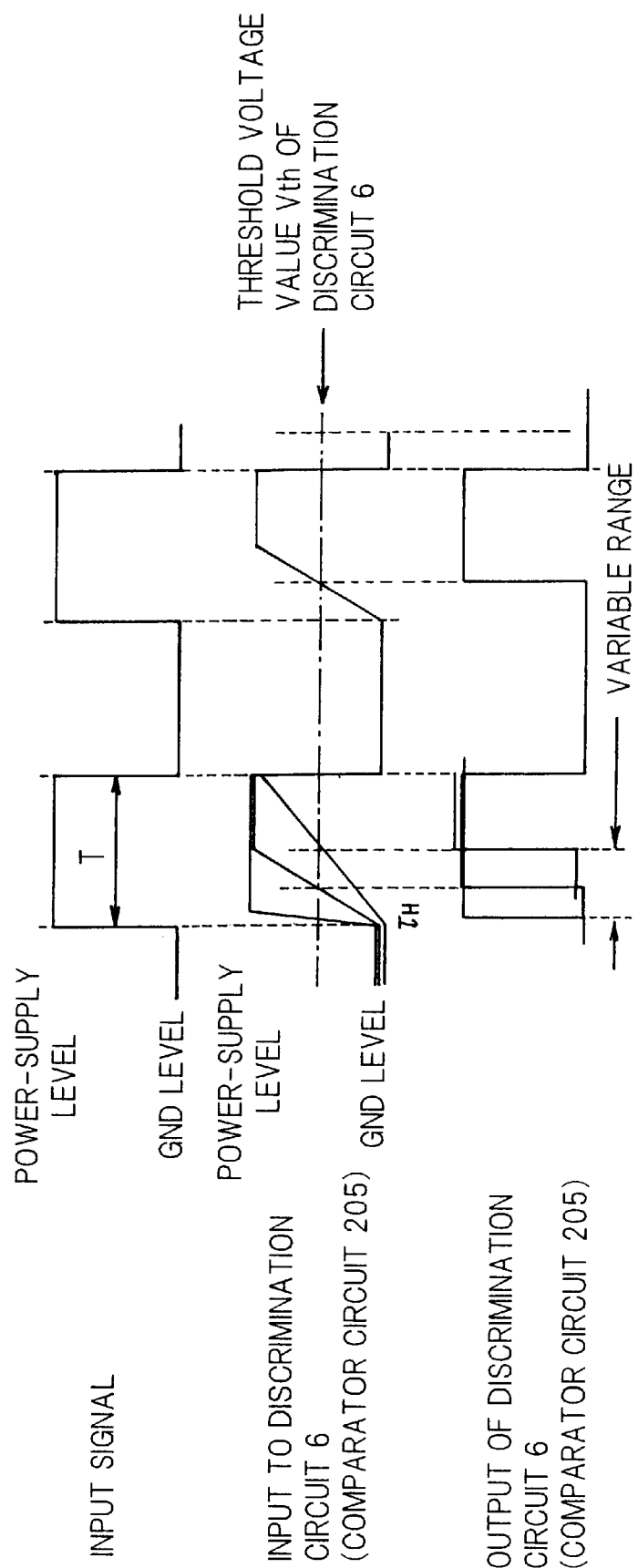
FIG. 6 is a diagram useful in describing the operation of the second embodiment.

FIG. 5 is a diagram showing the construction of a second embodiment obtained by modifying the first embodiment so as to delay only the rising-edge timing of an input signal, and FIG. 6 is a waveform diagram useful in describing the operation of the second embodiment.

In FIG. 5, the charging current control circuit 1 performs control in such a manner that a charging current flows into the capacitor 5 when an input signal to the circuit is at the level of the power supply. The discharge current control circuit 2 performs control in such a manner that a discharge current is released from the capacitor 5 when the input signal is at the level of ground. The P-MOS transistor 3 and the N-MOS transistor 4 have their drains connected in series to construct a CMOS charge pump. The source of the P-MOS transistor 3 is connected to the power-supply line and its gate terminal is connected to the charging current control circuit 1. The source of the N-MOS transistor 4 is connected to the ground line and its gate terminal is connected to the discharge current control circuit 2. The capacitor 5, which is for charge and discharge, is connected in parallel with the N-MOS transistor 4 across the drain terminal of the charge pump and the ground line. The discrimination circuit 6 determines whether the terminal voltage of the capacitor 5 is equal to or greater than a predetermined threshold level and outputs a signal of a prescribed logic level in dependence upon the determination made.

The charging current control circuit 1 is composed of P-MOS transistors 10, 11, and the discharge current control circuit 2 is constituted by an inverter circuit comprising a P-MOS transistor 201 and an N-MOS transistor 202. The discrimination circuit 6 comprises a comparator 205 and a voltage source 206.

The P-MOS transistor 10 of the charging current control circuit 1 acts as a switch and is turned off if the input signal is at the power-supply level and on if the input signal is at the ground level. The P-MOS transistor 11 and the P-MOS transistor 3 construct a current mirror circuit. Accordingly, if the input signal is at the power-supply level, the delay control current 7 flows through the P-MOS transistor 11 and not the P-MOS transistor 10. As a result, a current proportional to the delay control current 7 flows into the P-MOS transistor 3 owing to the current mirror function and the P-MOS transistor 3 acts as a current source that introduces charging current. If the input signal is at the ground level, the delay control current 7 flows through the P-MOS transistor 10 and not the P-MOS transistor 11. Owing to the current mirror function, therefore, the P-MOS transistor 3 turns off and no charging current flows. Accordingly, a charging current that prevails when the input signal rises from the ground level to the power-supply level can be controlled by the delay control current 7, and the delay time of the rising edge can be controlled.

The output of the inverter circuit constituting the discharge current control circuit 2 is the ground level if the input signal is at the power-supply level and is at the power-supply level if the input signal is at the ground level. The N-MOS transistor 4, therefore, acts as a switch and is turned off if the input signal is at the power-supply level. If the input signal is at the ground level, the N-MOS transistor 4 turns on, the capacitor 5 conducts to the ground line to discharge the accumulated charge, and the input voltage (capacitor terminal voltage) of the discrimination circuit 6 is made the ground level instantaneously. The discrimination circuit 6 outputs the power-supply level if the input voltage is equal to or greater than the threshold level Vth and outputs the ground level if the input signal is less than the threshold level Vth.

By virtue of the foregoing operation, the second embodiment is such that the falling-edge delay time is fixed (zero), as shown in FIG. 6. It is possible to control only the rising-edge delay time $\tau_H$ of the input signal by the delay control current 7, and the input and output are not inversely related.

(D) Third Embodiment of CMOS Delay Circuit

Figure 7:
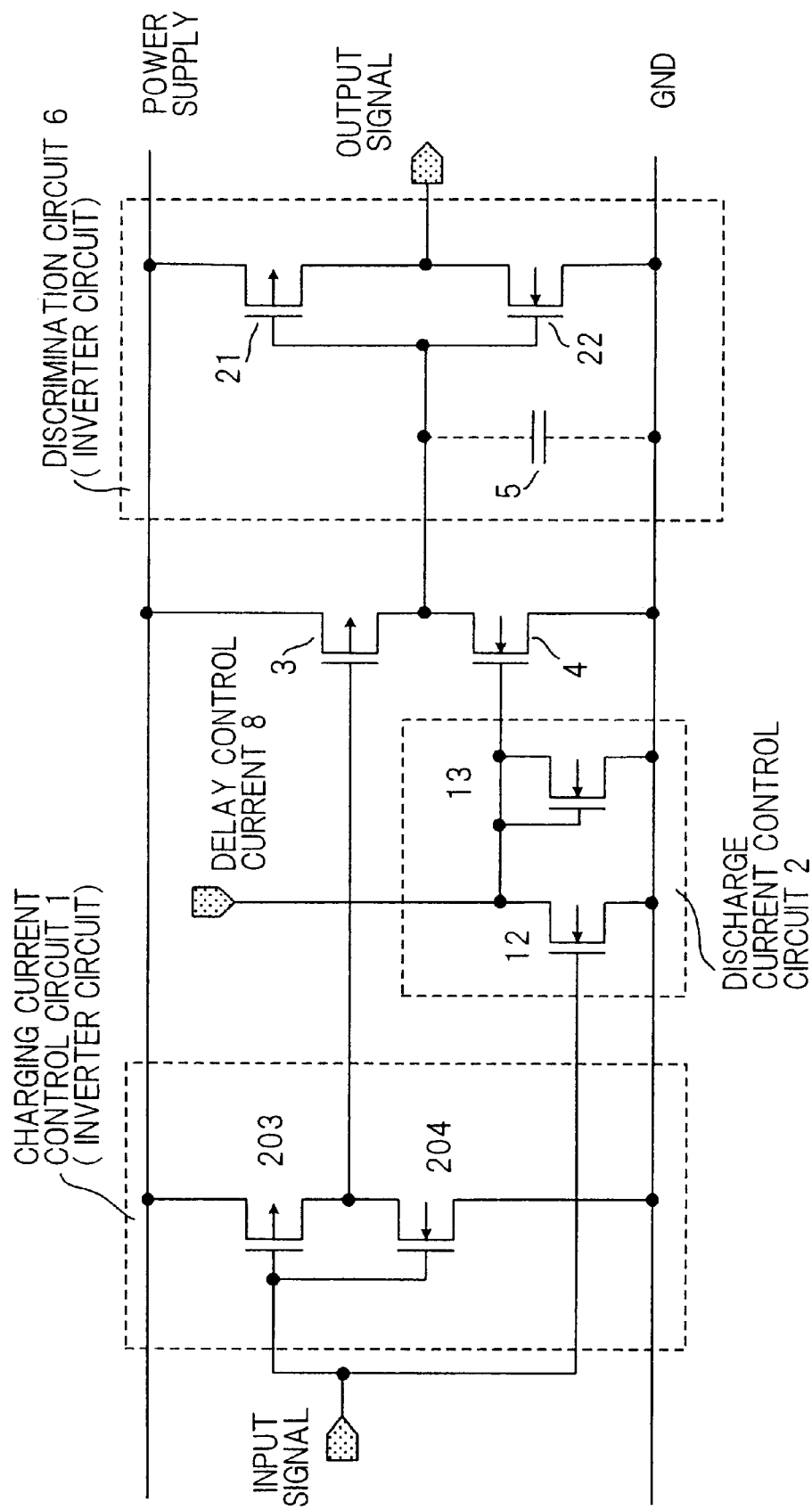
FIG. 7 is a diagram showing a third embodiment of a CMOS delay circuit according to the present invention.
Figure 8:
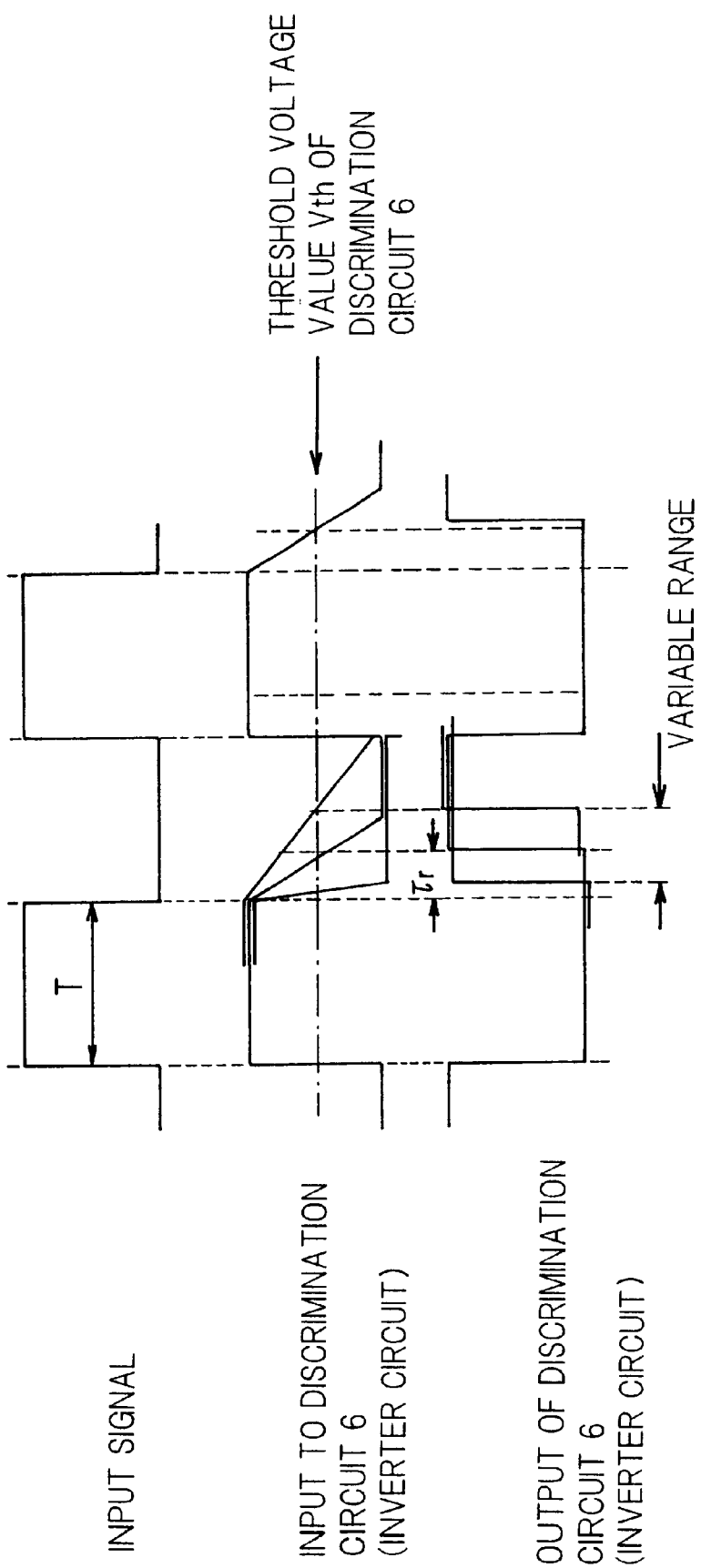
FIG. 8 is a diagram useful in describing the operation of the third embodiment.

FIG. 7 is a diagram showing the construction of a third embodiment obtained by modifying the first embodiment so as to delay only the falling-edge timing of an input signal, and FIG. 8 is a waveform diagram useful in describing the operation of the third embodiment.

In FIG. 7, the charging current control circuit 1 performs control in such a manner that a charging current flows into the capacitor 5 when an input signal to the circuit is at the level of the power supply. The discharge current control circuit 2 performs control in such a manner that a discharge current is released from the capacitor 5 when the input signal is at the ground level. The P-MOS transistor 3 and the N-MOS transistor 4 have their drains connected in series to construct a CMOS charge pump. The source of the P-MOS transistor 3 is connected to the power-supply line and its gate terminal is connected to the charging current control circuit 1. The source of the N-MOS transistor 4 is connected to the ground line and its gate terminal is connected to the discharge current control circuit 2. The capacitor 5, which is for charge and discharge, is connected in parallel with the N-MOS transistor 4 across the drain terminal of the charge pump and the ground line. The discrimination circuit 6 determines whether the terminal voltage of the capacitor 5 is equal to or greater than a predetermined threshold level and outputs a signal of a prescribed logic level in dependence upon the determination made.

The charging current control circuit 1 is constituted by an inverter circuit comprising a P-MOS transistor 203 and an N-MOS transistor 204, and the discharge current control circuit 2 is composed of the N-MOS transistors 12, 13. The discrimination circuit 6 is constituted by an inverter circuit comprising the P-MOS transistor 21 and the N-MOS transistor 22, and the input capacitance of the discrimination circuit 6 serves as the capacitor 5.

The output of the inverter circuit constituting the charging current control circuit 1 is the ground level if the input signal is at the power-supply level and is at the power-supply level if the input signal is at the ground level. The P-MOS transistor 3, therefore, acts as a switch and is turned off if the input signal is at the ground level. If the input signal is at the power-supply level, the P-MOS transistor 3 turns on, the capacitor 5 becomes connected to the power-supply line and is charged, and the input voltage (capacitor terminal voltage) of the discrimination circuit 6 is made the power-supply level instantaneously. The discrimination circuit 6 outputs the power-supply level if the input voltage is the ground level and outputs the ground level if the input signal is the power-supply level. When the input signal rises from the ground level to the power-supply level, therefore, the output signal becomes the ground level instantaneously.

The N-MOS transistor 12 of the discharge current control circuit 2 acts as a switch and is turned off if the input signal is at the ground level and turned on if the input signal is at the power-supply level. The N-MOS transistor 13 and the N-MOS transistor 4 construct a current mirror circuit. Accordingly, if the input signal is at the ground level, the delay control current 8 flows through the N-MOS transistor 13 and not the N-MOS transistor 12. As a result, a current proportional to the delay control current 8 flows into the N-MOS transistor 4 owing to the current mirror function and the N-MOS transistor 4 acts as a current source that passes a discharge current. If the input signal is at the power-supply level, the delay control current 8 flows through the N-MOS transistor 12 and not the M-MOS transistor 13. Owing to the current mirror function, therefore, the N-MOS transistor 4 turns off and no discharge current flows. Accordingly, a discharge current that prevails when the input signal falls from the power-supply level to the ground level can be controlled by the delay control current 8, and the delay time of the falling edge can be controlled.

By virtue of the foregoing operation, the third embodiment is such that the rising-edge delay time is fixed (zero), as shown in FIG. 8. It is possible to control only the falling-edge delay time $\tau_T$ of the input signal by the delay control current 8, and the input and output are not inversely related. It should be noted that the CMOS delay circuit of the third embodiment is capable of being used as a pulse-width control circuit as well.

(E) Fourth Embodiment of CMOS Delay Circuit

Figure 9:
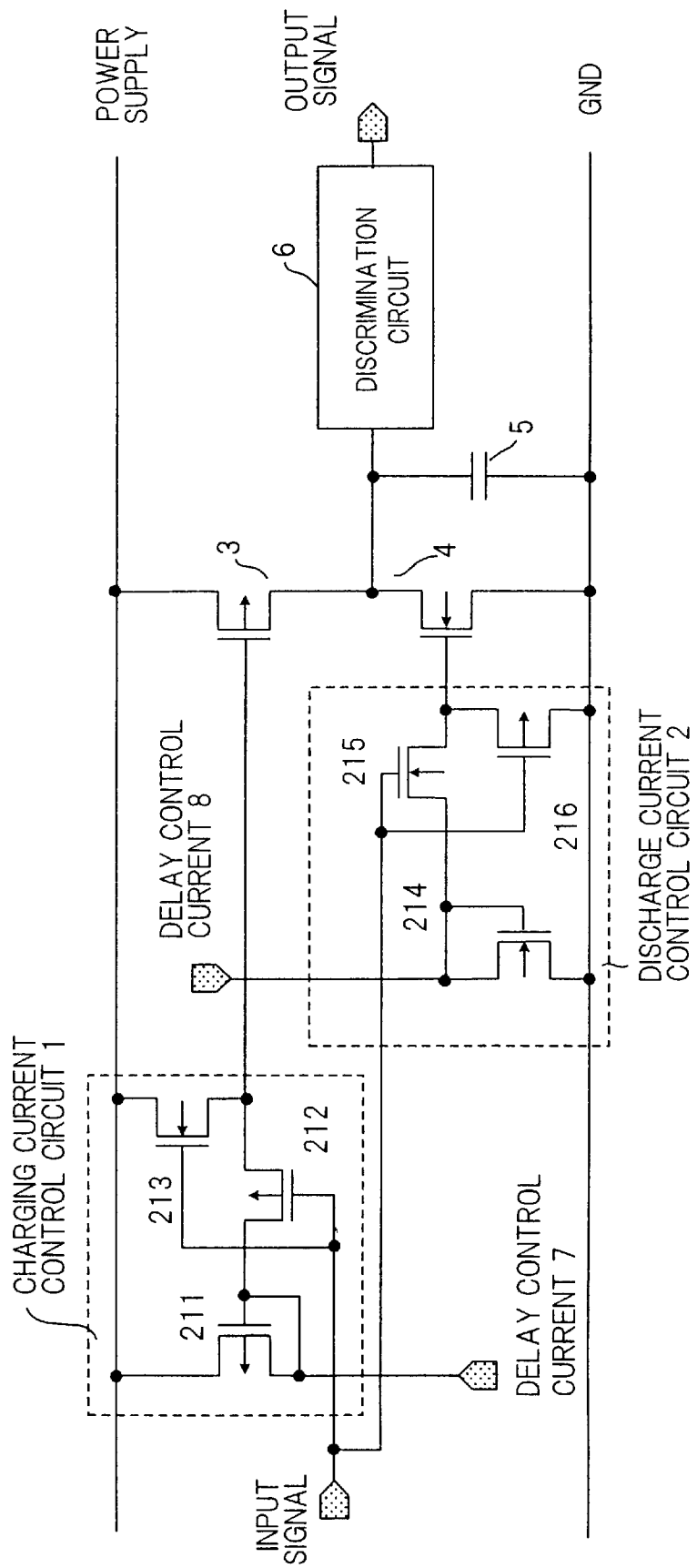
FIG. 9 is a diagram showing a fourth embodiment of a CMOS delay circuit according to the present invention.
Figure 10:
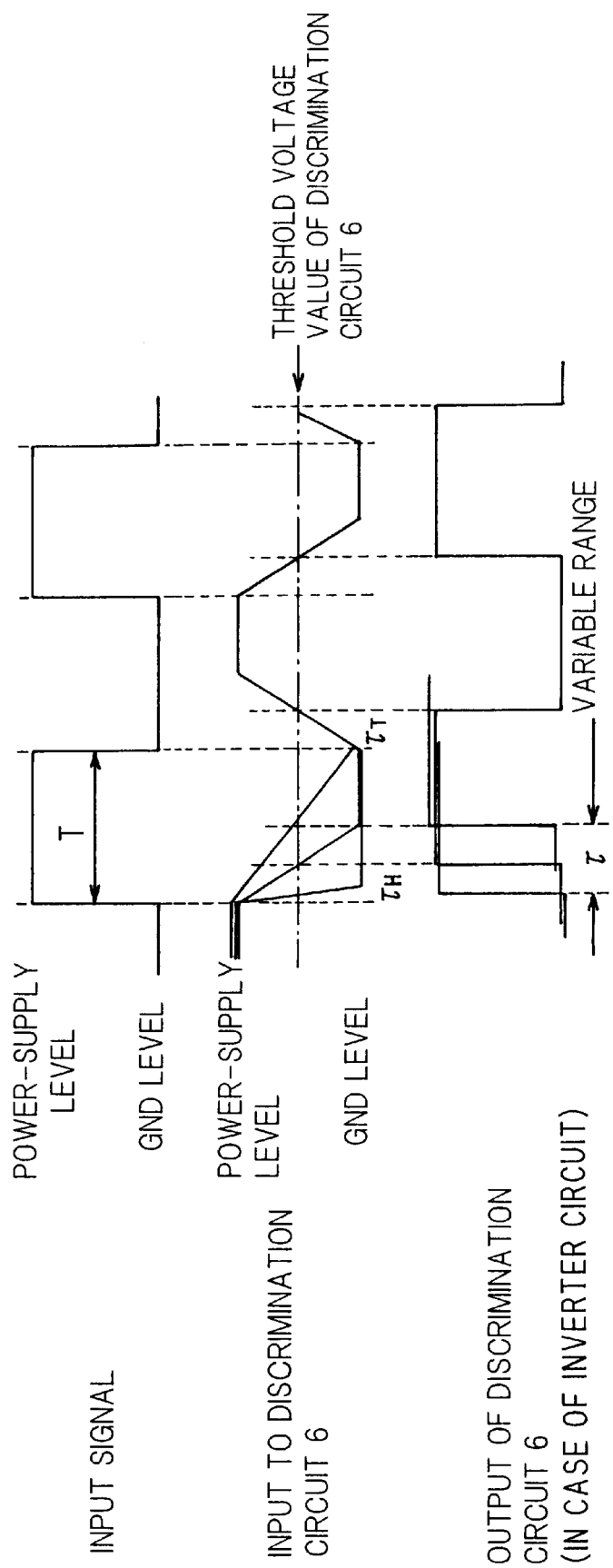
FIG. 10 is a diagram useful in describing the operation of the fourth embodiment.

FIG. 9 is a diagram showing the construction of a fourth embodiment, and FIG. 10 is a waveform diagram useful in describing the operation of the fourth embodiment.

In FIG. 9, the charging current control circuit 1 performs control in such a manner that a charging current flows into the capacitor 5 when an input signal to the circuit is at the ground level. The discharge current control circuit 2 performs control in such a manner that a discharge current is released from the capacitor 5 when the input signal is at the power-supply level. The P-MOS transistor 3 and the N-MOS transistor 4 have their drains connected in series to construct a CMOS charge pump. The source of the P-MOS transistor 3 is connected to the power-supply line and its gate terminal is connected to the charging current control circuit 1. The source of the N-MOS transistor 4 is connected to the ground line and its gate terminal is connected to the discharge current control circuit 2. The capacitor 5, which is for charge and discharge, is connected in parallel with the N-MOS transistor 4 across the drain terminal of the charge pump and the ground line. The discrimination circuit 6 determines whether the terminal voltage of the capacitor 5 is equal to or greater than a predetermined threshold level and outputs a signal of a prescribed logic level in dependence upon the determination made. The delay control currents 7 and 8 flow through the charging current control circuit 1 and discharge current control circuit 2, respectively, under the control of a current control circuit (see FIG. 4), which is not shown in FIG. 9.

The charging current control circuit 1 is composed of P-MOS transistors 211, 212 and an N-MOS transistor 213 and is so adapted that the delay control current 7 flows into the P-MOS transistor 211 at all times. The discharge current control circuit 2 is composed of N-MOS transistors 214, 215 and a P-MOS transistor 216 and is so adapted that the delay control current 8 flows into the N-MOS transistor 214 at all times.

When the input signal to the charging current control circuit 1 is at the power-supply level, the P-MOS transistor 212 turns off and the N-MOS transistor 213 turns on. As a result, the output of the charging current control circuit I attains the power-supply level, the P-MOS transistor 3 turns off and no charging current flows. When the input signal is at the ground level, on the other hand, the P-MOS transistor 212 turns on and the N-MOS transistor 213 turns off. Consequently, the P-MOS transistor 211 and the P-MOS transistor 3 construct a current mirror circuit and the P-MOS transistor 3 acts as a charging current source for passing a current that is proportional to the delay control current 7.

Similarly, when the input signal is at the power-supply level, the N-MOS transistor 4 acts as a discharge current source for passing a current that is proportional to the delay control current 8 under the control of the discharge current control circuit 2. More specifically, when the input signal to the discharge current control circuit 2 is at the ground level, the N-MOS transistor 215 turns off and the P-MOS transistor 216 turns on. As a result, the output of the discharge current control circuit 2 attains the ground level, the N-MOS transistor 4 turns off and no discharge current flows. When the input signal is at the power-supply level, on the other hand, the N-MOS transistor 215 turns on and the P-MOS transistor 216 turns off. Consequently, the N-MOS transistor 214 and the N-MOS transistor 4 construct a current mirror circuit and the N-MOS transistor 4 acts as a discharge current source for passing a current that is proportional to the delay control current 8.

By virtue of the foregoing operation, the input voltage of the discrimination circuit 6 can be controlled so as to vary at a constant slope from the power-supply level to the ground level and from the ground level to the power-supply level, as shown in FIG. 10. This means that it is possible to obtain a CMOS delay circuit having a broad range τ over which delay time can be varied and a small variance in terms of delay time. Further, it is possible to obtain a CMOS delay circuit in which delay time can be controlled while the rising-edge and falling-edge delay times $\tau_H$, $\tau_T$ kept equal, as a result of which there is no change in the input and output pulse widths.

(F) Fifth Embodiment of CMOS Delay Circuit

Figure 11:
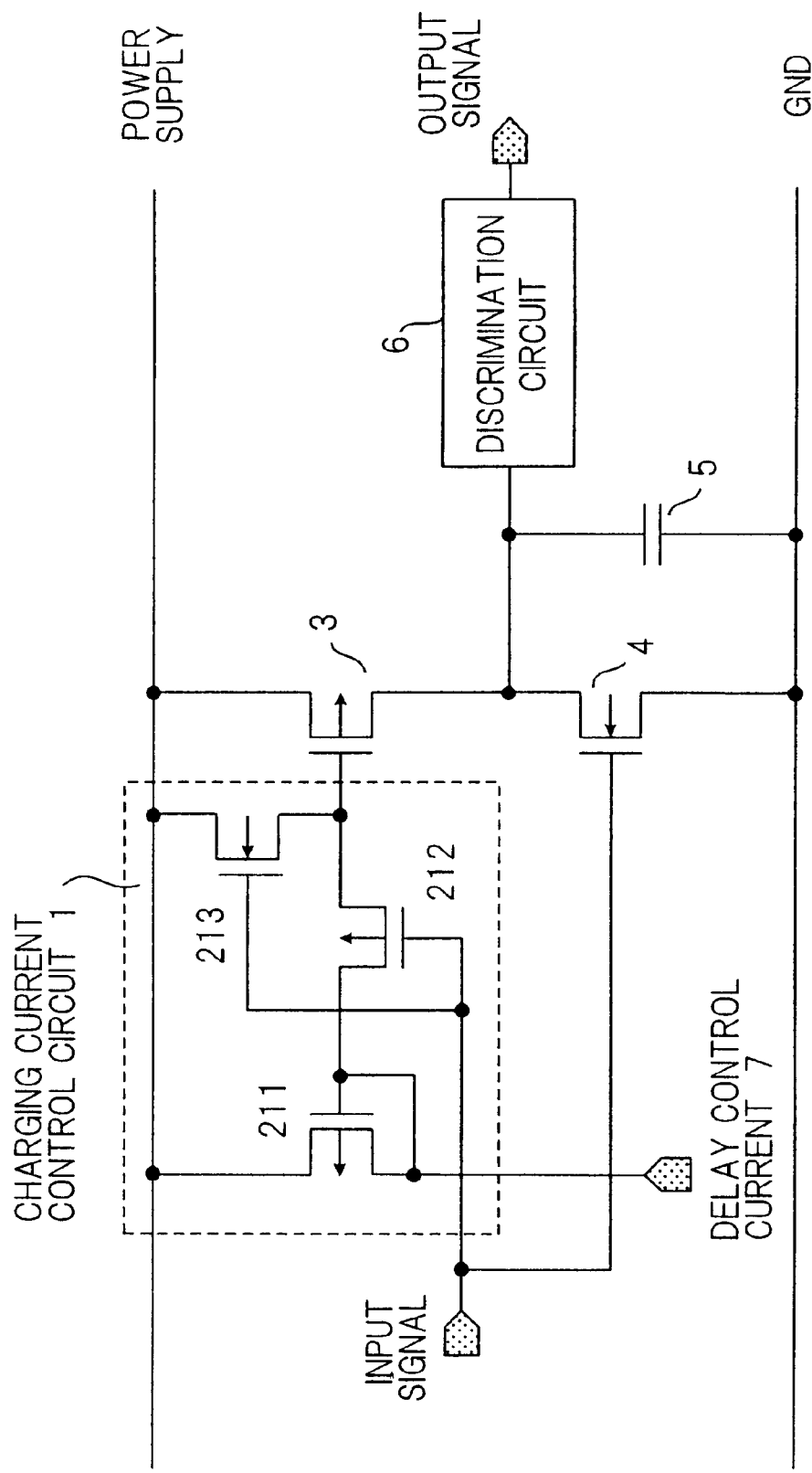
FIG. 11 is a diagram showing a fifth embodiment of a CMOS delay circuit according to the present invention.
Figure 12:
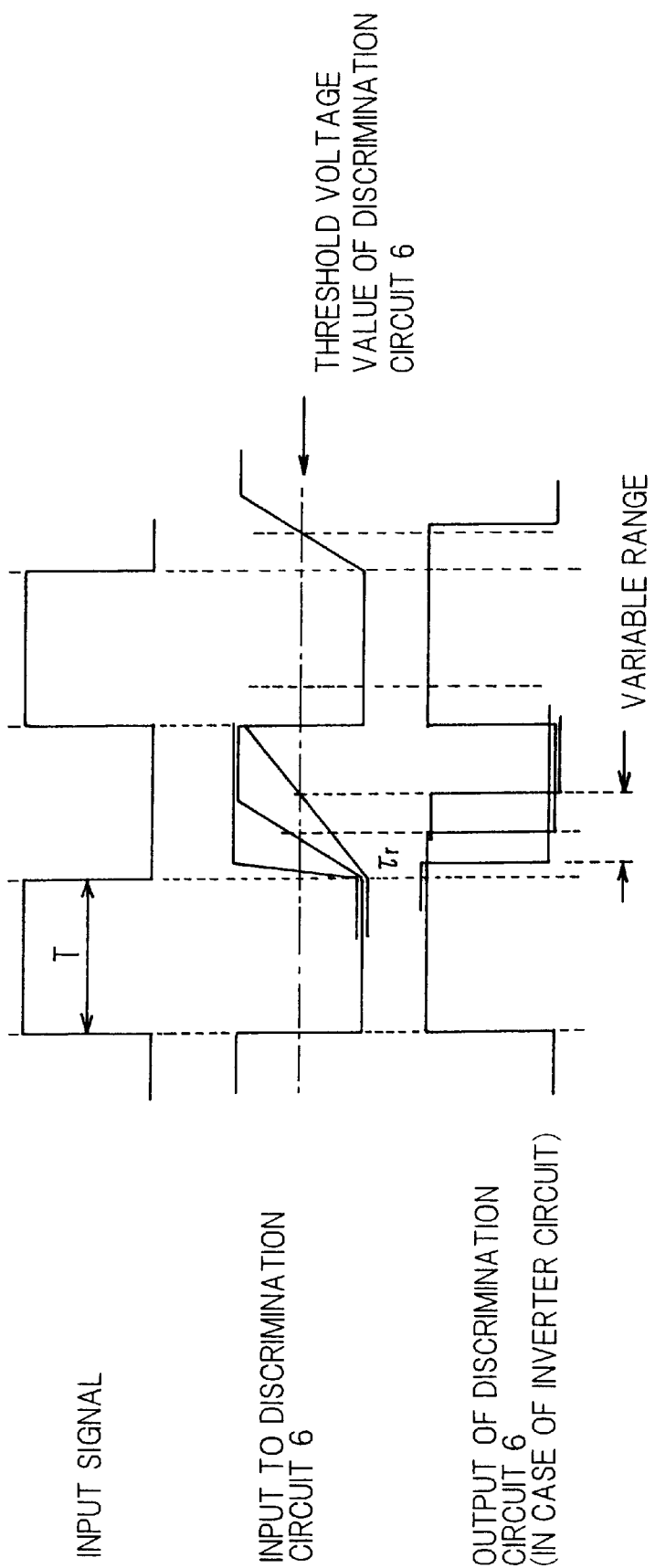
FIG. 12 is a diagram useful in describing the operation of the fifth embodiment.

FIG. 11 is a diagram showing the construction of a fifth embodiment obtained by modifying the fourth embodiment so as to delay only the rising-edge timing of an input signal, and FIG. 12 is a waveform diagram useful in describing the operation of the fifth embodiment.

In the fifth embodiment, the discharge current control circuit 2 of the fourth embodiment is eliminated and the signal input terminal is connected directly to the N-MOS transistor 4. The N-MOS transistor 4 acts as a switch for turning a discharge current on and off. The N-MOS transistor 4 is turned on when the input signal is at the ground level and is turned off when the input signal is at the power-supply level, thereby connecting the capacitor 5 to the ground line to discharge the accumulated electric charge and send the input voltage (the terminal voltage of capacitor 5) of the discrimination circuit 6 to the ground level instantaneously. The discrimination circuit 6 outputs the ground level if the input voltage is equal to or greater than the threshold level Vth and outputs the power-supply level if the input signal is less than the threshold level Vth.

By virtue of the foregoing operation, the fifth embodiment is such that the falling-edge delay time is fixed (zero), as shown in FIG. 12. It is possible to control only the rising-edge delay time $\tau_T$ of the input signal by the delay control current 7, and the input and output are not inversely related.

It should be noted that the charging current control circuit 1 of the fourth embodiment (FIG. 9) may be eliminated and the signal input terminal connected directly to the P-MOS transistor 3 in a manner similar to that described above, thereby making it possible to construct a CMOS delay circuit in which only the rising edge of the input signal is delayed.

(G) Sixth Embodiment of CMOS Delay Circuit

Figure 13:
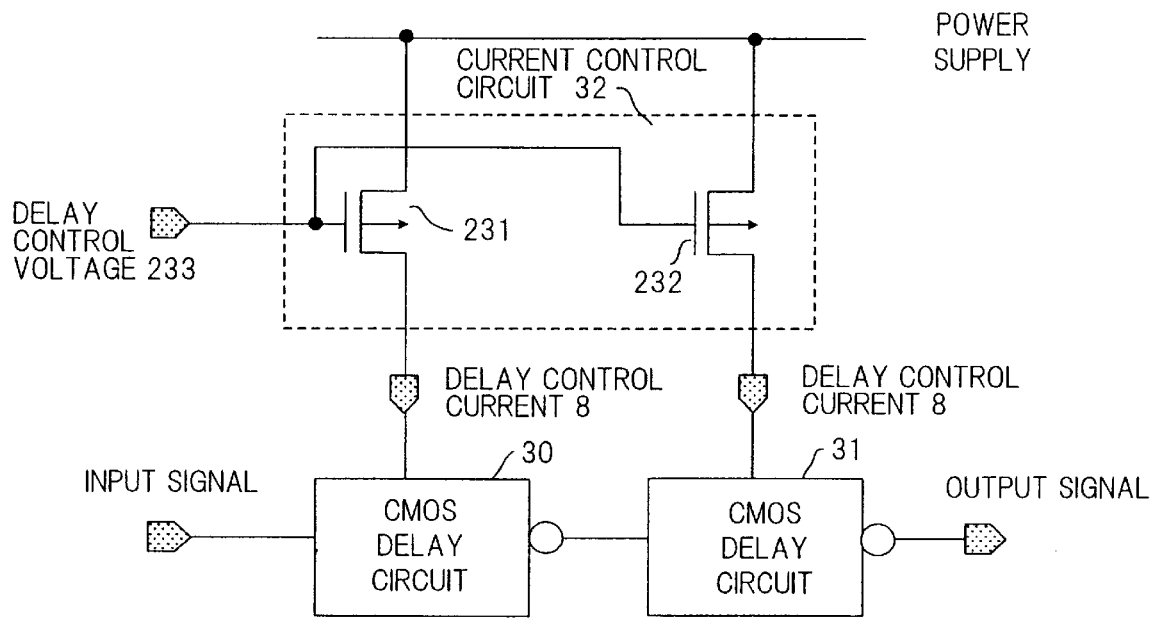
FIG. 13 is a diagram showing a sixth embodiment of a CMOS delay circuit according to the present invention.
Figure 14:
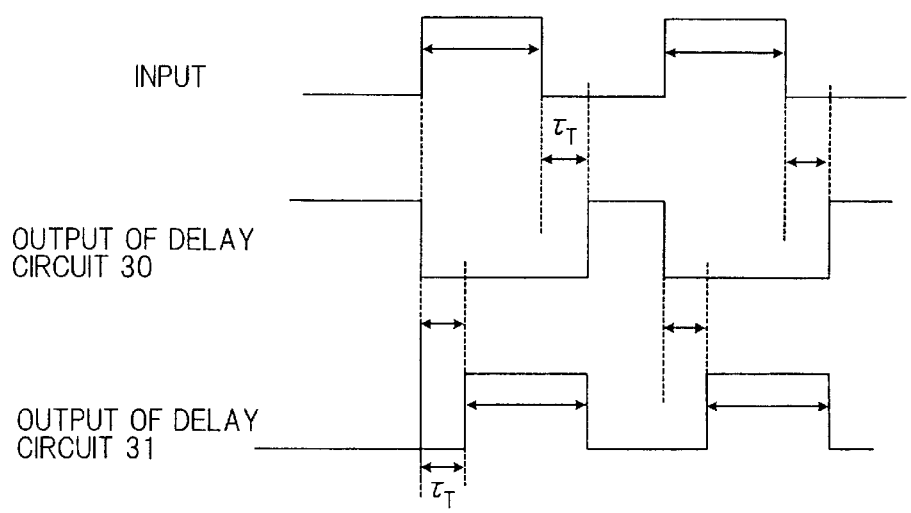
FIG. 14 is a diagram useful in describing the operation of the sixth embodiment.

FIG. 13 is a diagram showing a sixth embodiment of a CMOS delay circuit for making the pulse width of the input signal and the pulse width of the output signal equal, and FIG. 14 is a waveform diagram useful in describing the operation of the sixth embodiment.

CMOS delay circuits (see FIG. 7) 30, 31 of the third embodiment are serially connected and, as shown in FIG. 8, each delays only the falling edge of its input signal and has an input and an output that are in a mutually inverse relationship. A current control circuit 32 is adapted to apply a delay control voltage 233 to the gates of P-MOS transistors 231, 232 of identical characteristics so that equal currents flow into these transistors. The currents that flow through these P-MOS transistors 231, 232 flow into the CMOS delay circuits 30, 31 as delay control currents 8. Since the delay control currents 8 that flow into the CMOS delay circuits 30, 31 are equal, the discharge currents also are equal and so are the falling-edge delay times $\tau_T$ of the two delay circuits.

As shown in FIG. 14, the rising edge of the input signal is not delayed in the CMOS delay circuit 30 and is delayed by $\tau_T$ in the CMOS delay circuit 31. On the other hand, the falling edge of the input signal is delayed by $\tau_T$ in the CMOS delay circuit 30 and is not delayed in the CMOS delay circuit 31. Overall, therefore, the input signal has both its rising and falling edges delayed by $\tau_T$. Thus there is obtained a CMOS delay circuit that applies a time delay $\tau_T$ without any change in the pulse width of the input and output signals.

(H) Seventh Embodiment of CMOS Delay Circuit

Figure 15:
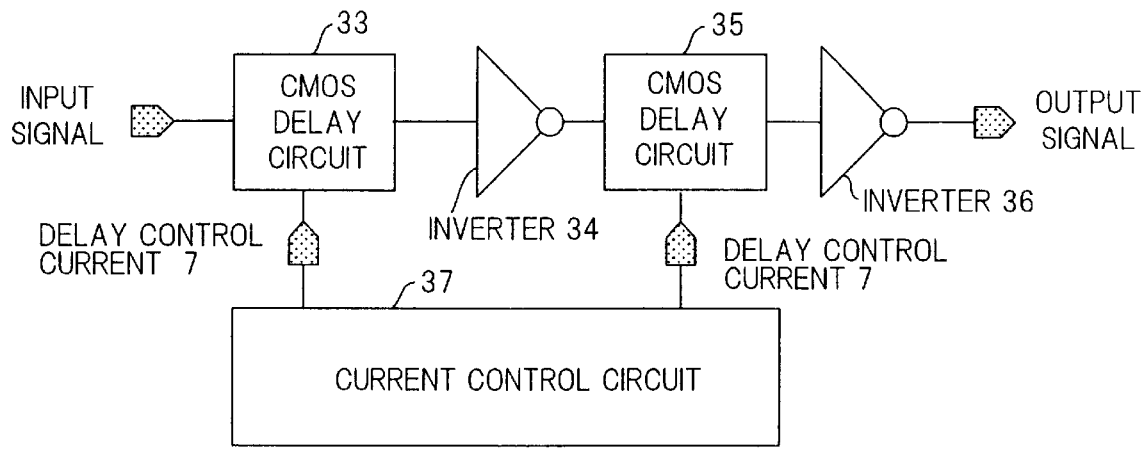
FIG. 15 is a diagram showing a seventh embodiment of a CMOS delay circuit according to the present invention.
Figure 16:
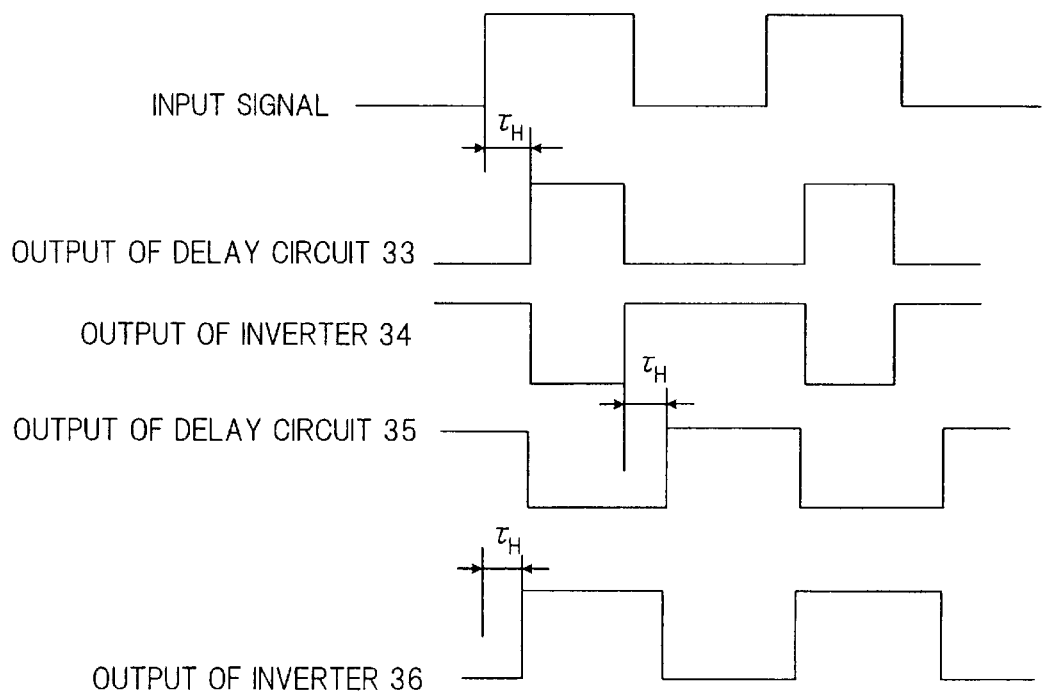
FIG. 16 is a diagram useful in describing the operation of the seventh embodiment.

FIG. 15 is a diagram showing a seventh embodiment of a CMOS delay circuit for making the pulse width of the input signal and the pulse width of the output signal equal, and FIG. 16 is a waveform diagram useful in describing the operation of the seventh embodiment.

CMOS delay circuits (see FIG. 5) 33, 35 delay only the rising edge of the input signal thereto and have an input and an output that are not in a mutually inverse relationship, as illustrated in FIG. 6. Inverters 34, 36 invert the signal level. The CMOS delay circuits 33, 34 and the inverters 34, 36 are serially connected as shown. A current control circuit 37 has a construction identical with that of the current control circuit 32 according to the sixth embodiment (FIG. 13) and is so adapted that equal delay control currents 7 flow into the CMOS delay circuits 33, 35. Since the delay control currents 7 that flow into these CMOS delay circuits 33, 35 are equal, the charging currents are equal and so are the rising-edge delay times $\tau_H$ of the two delay circuits.

The CMOS delay circuit 33 and inverter 34 correspond to the CMOS delay circuit 30 of the sixth embodiment, the CMOS delay circuit 35 and inverter 36 correspond to the CMOS delay circuit 31 of the sixth embodiment, and these operate in the same manner as in the sixth embodiment to output a signal of delay time $\tau_H$, the output signal having a pulse width no different from that of the input signal.

As shown in FIG. 16, the rising edge of the input signal is delayed by $\tau_H$ only in the CMOS delay circuit 33, is inverted by the inverter 34, is not delayed by the CMOS delay circuit 35 and is inverted by the inverter 36. On the other hand, the falling edge of the input signal is not delayed by the CMOS delay circuit 33, is inverted by the inverter 34, is delayed by $\tau_H$ in the CMOS delay circuit 35 and is inverted by the inverter 36. Overall, therefore, the input signal has both its rising and falling edges delayed by $\tau_H$. Consequently, it is possible to output a signal having a time delay $\tau_H$, the output signal having a pulse width no different from that of the input signal.

(I) Eighth Embodiment of CMOS Delay Circuit

Figure 17:
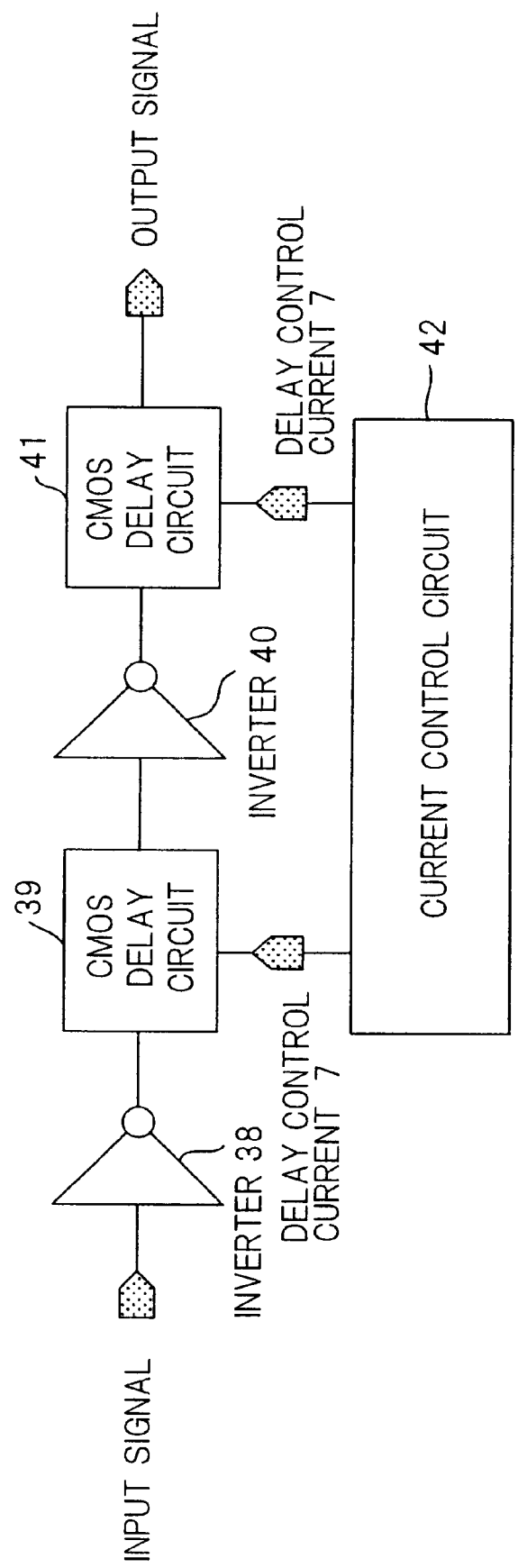
FIG. 17 is a diagram showing an eighth embodiment of a CMOS delay circuit according to the present invention.

FIG. 17 is a diagram showing an eighth embodiment of a CMOS delay circuit for making the pulse width of the input signal and the pulse width of the output signal equal.

CMOS delay circuits (see FIG. 5) 39, 41 delay only the rising edge of the input signal thereto and have an input and an output that are not in a mutually inverse relationship, as illustrated in FIG. 6. Inverters 38, 39 invert the signal level. The CMOS delay circuits 39, 41 and the inverters 38, 40 are serially connected as shown. A current control circuit 42 has a construction identical with that of the current control circuit 32 according to the sixth embodiment (FIG. 13) and is so adapted that equal delay control currents 7 flow into the CMOS delay circuits 39, 41. Since the delay control currents 7 that flow into these CMOS delay circuits 39, 41 are equal, the charging currents are equal and so are the rising-edge delay times $\tau_H$ of the two delay circuits.

The seventh and eighth embodiments differ only in terms of whether the inversion is performed before or after the delay in each CMOS delay circuit. Accordingly, in a manner similar to that of the seventh embodiment, the eighth embodiment makes it possible to output a signal having a time delay $\tau_H$, the output signal having a pulse width no different from that of the input signal.

(J) First Embodiment of Oscillation Circuit Using CMOS Delay Circuits

Figure 18:
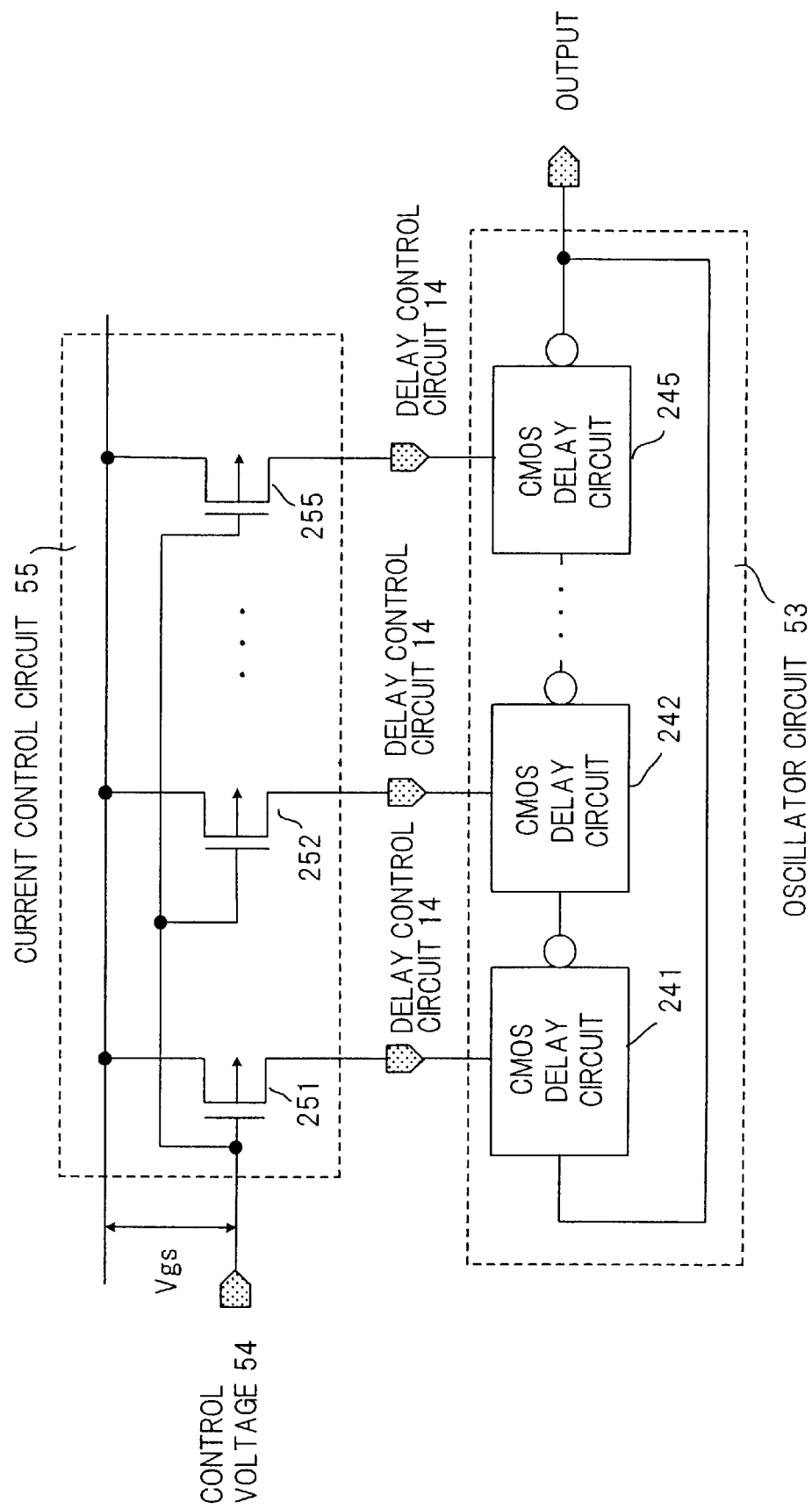
FIG. 18 is a diagram showing a first embodiment of an oscillator circuit according to the present invention.

FIG. 18 is a diagram showing the construction of a first embodiment of an oscillator circuit using CMOS delay circuits. The oscillator circuit is constructed by connecting serially, in the form of a ring, an odd number of CMOS delay circuits whose input and output signal levels are the inverse of each other.

As shown in FIG. 18, an oscillator circuit 53 is constructed by connecting serially, in the form of a ring, an odd number of CMOS delay circuits 241–245 (see the first embodiment in FIG. 2) whose input and output signal levels are the inverse of each other. A current control circuit 55 has P-MOS transistors 251–255 for passing delay control currents 14 into the CMOS delay circuits 241–245, respectively. The current control circuit 55 is capable of controlling, by a control voltage 54, the value of the delay control currents 14 that flow into the CMOS delay circuits 241–245. As a result, oscillation frequency can be changed by changing delay time.

Figure 19:
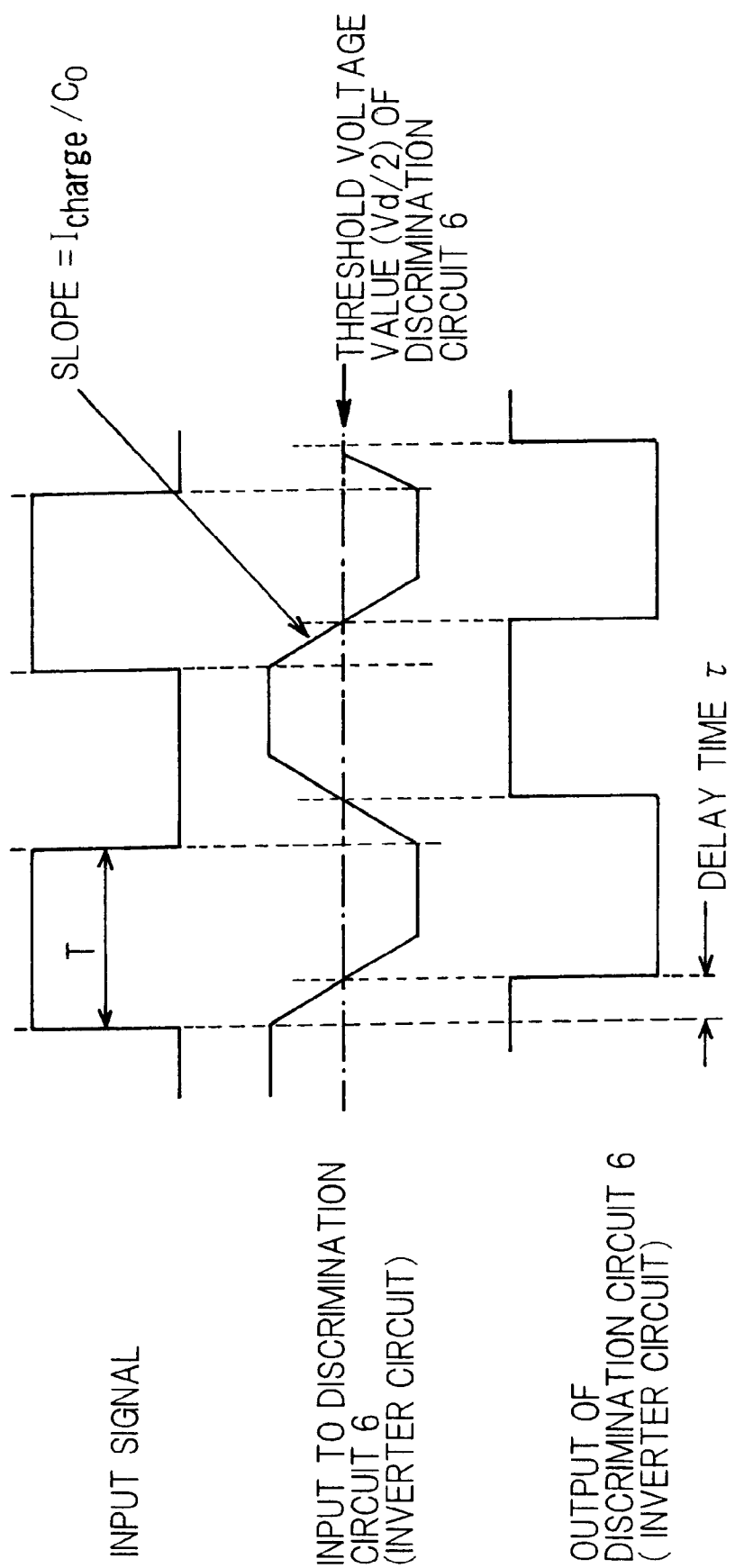
FIG. 19 is a diagram useful in describing the operation of a CMOS delay circuit of the first embodiment (oscillator circuit)
Figure 20:
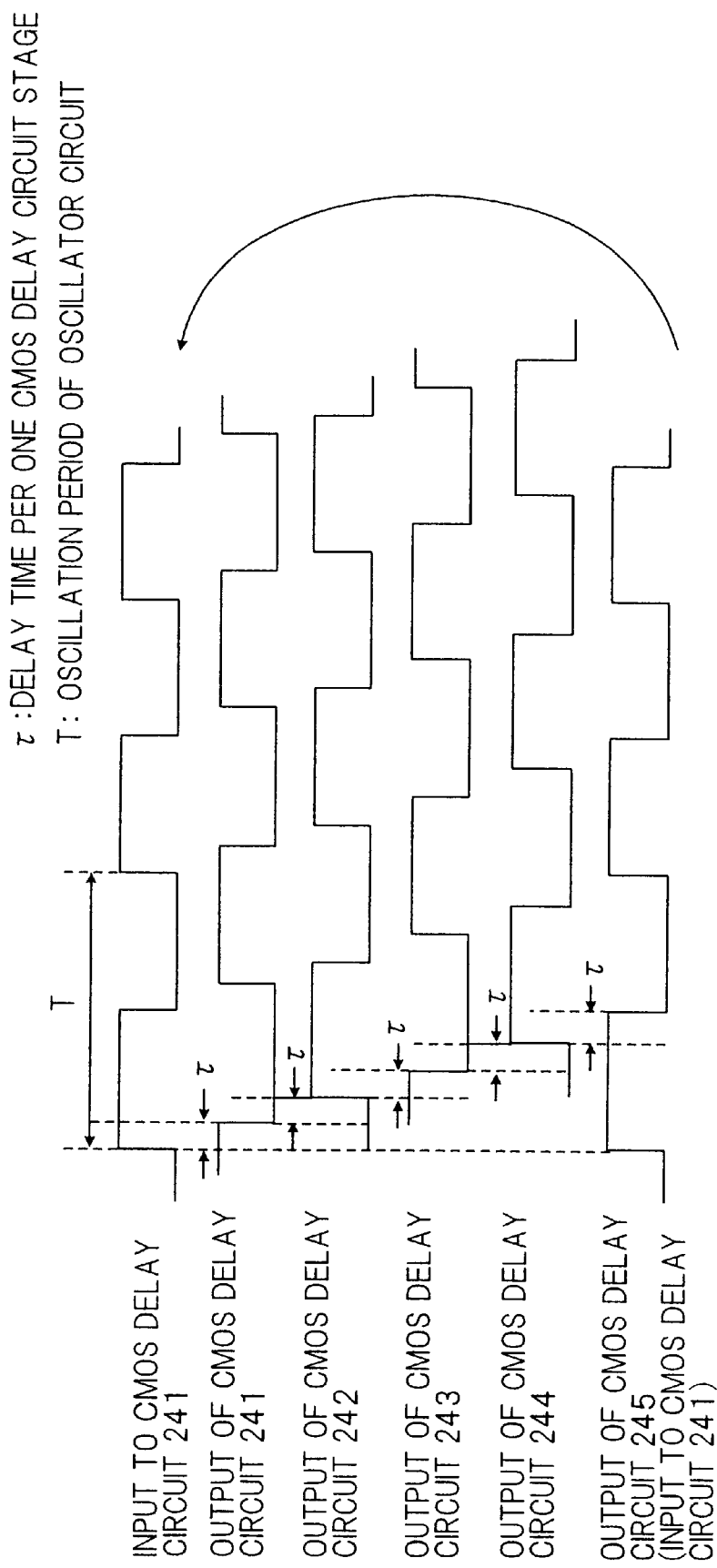
FIG. 20 is a waveform diagram useful in describing the operation of the first embodiment (oscillator circuit)

FIG. 19 is a diagram useful in describing the operation of each CMOS delay circuit. The characteristics of the CMOS delay circuits are such that the delay time is $\tau$, with the output and input of each CMOS delay circuit being in inverse relationship. It should be noted that the input waveform of the discrimination circuit 6 is the inverse of that shown in FIG. 3. FIG. 20 shows the input and output waveforms of the CMOS delay circuits 241–245, with the output of the last CMOS delay circuit 245 coinciding with the input of the first CMOS delay circuit 241.

The oscillation frequency of the oscillator circuit thus constructed is as follows: An output current (delay control current) Icnt output by the current control circuit 55 is varied by a control voltage $Vg_s$ in accordance with the following equation:

$$Icnt = (1/2) \cdot \beta \cdot (Vg_s - Vth)^2 \qquad (1)$$

where $\beta$ represents a drain current coefficient and Vth represents a threshold voltage value.

In a case where the construction of the first embodiment is adopted for the CMOS delay circuits 241–245, the delay time $\tau$ per delay circuit stage is given by the following equation if the threshold value of the discrimination circuit 6 is Vd/2:

$$\tau = (C_0 \cdot Vd)/(2 \cdot I_{charge}) \qquad (2)$$

where $C_0$ represents the capacitance of the capacitor 5, Vd the power-supply voltage and $I_{charge}$ the value of the charge/discharge current, which is proportional to Icnt. Assuming that $I_{charge} = Icnt$ holds for the sake of simplicity, we have $$\tau = (C_0 \cdot Vd)/(2 \cdot Icnt) \qquad (3)$$

If n represents the number of CMOS delay circuit stages, the following equation is established:

$$T/2 = n \cdot \tau \qquad (4)$$

where T represents the oscillation period. The frequency f, therefore, is given by $$f = 1/(2 \cdot n \cdot \tau) \qquad (5)$$

Accordingly, we derive the following from Equations (1), (3) and (5):

$$f = (1/2) \cdot \beta \cdot (Vg_s - Vth)^2/(n \cdot C_0 \cdot Vd) \qquad (6)$$

Thus, the oscillation frequency f can be controlled by the control voltage $Vg_s$. Further, since the CMOS delay circuits 241–245 have a broad range over which delay time can be varied, the range over which the oscillation frequency is variable can be enlarged.

(K) Second Embodiment of Oscillation Circuit Using CMOS Delay Circuits

Figure 21:
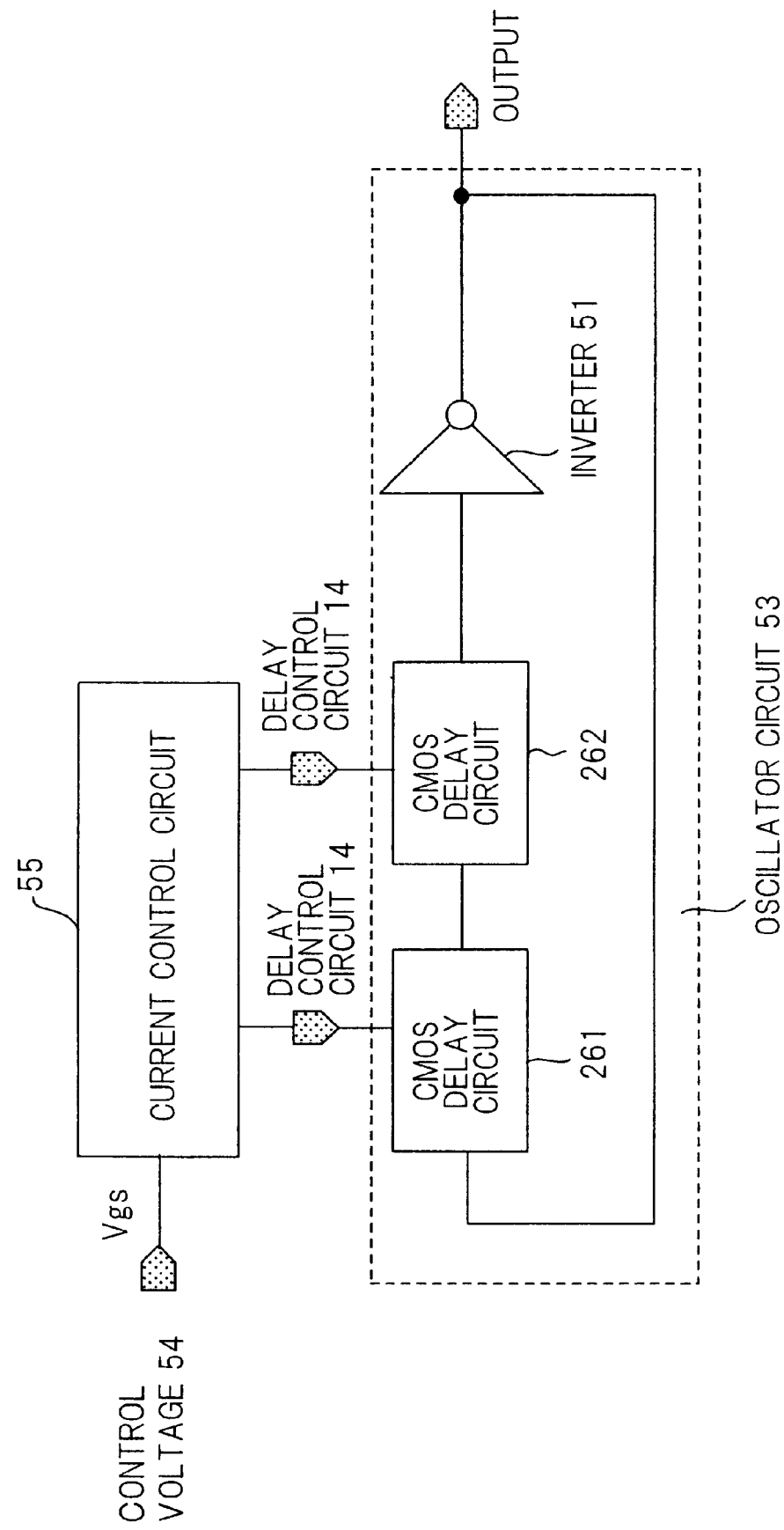
FIG. 21 is a diagram showing a second embodiment of an oscillator circuit according to the present invention.
Figure 22:
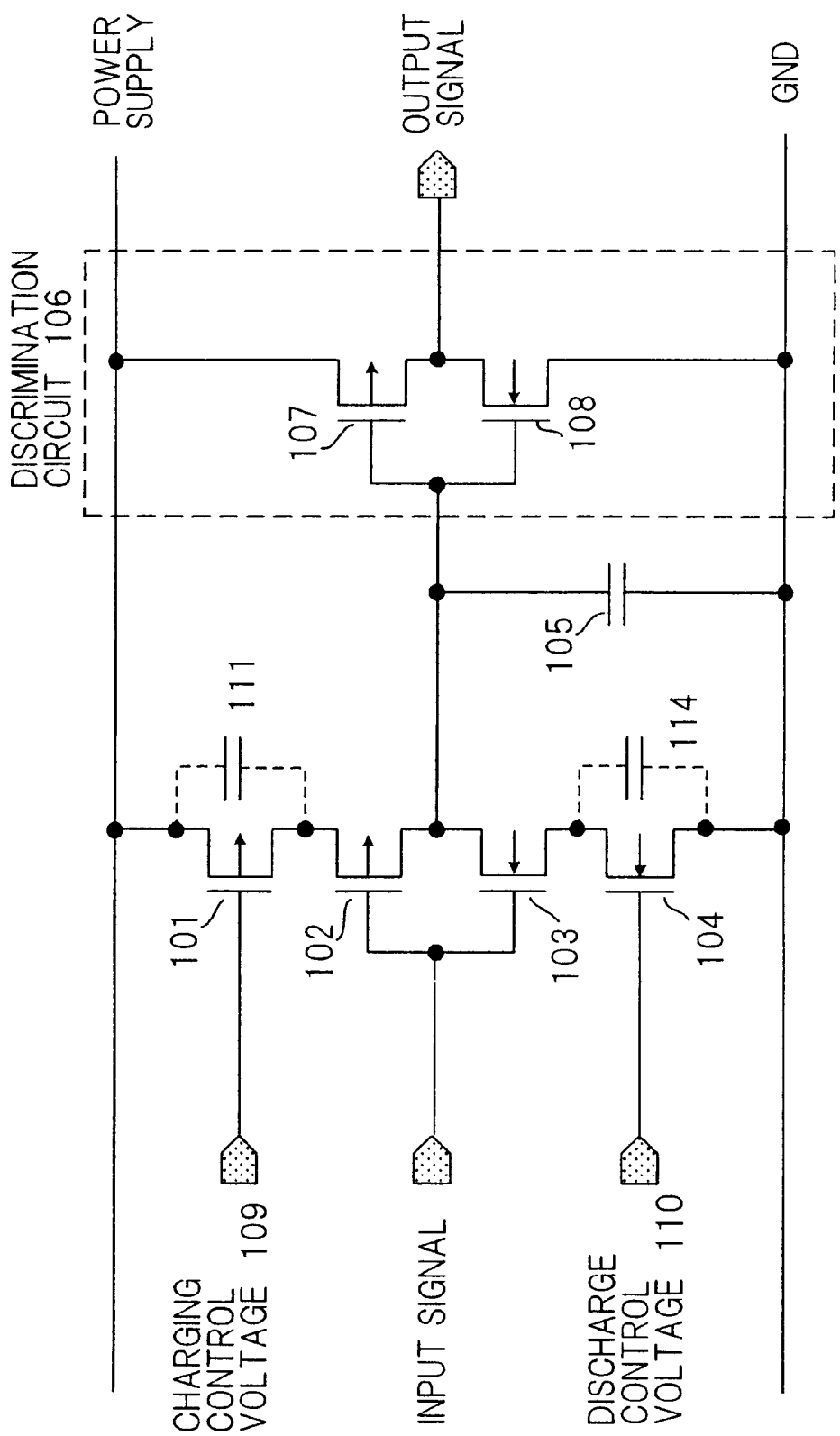
FIG. 22 is a diagram showing a CMOS pulse delay circuit according to the prior art.
Figures 23A, 23B:
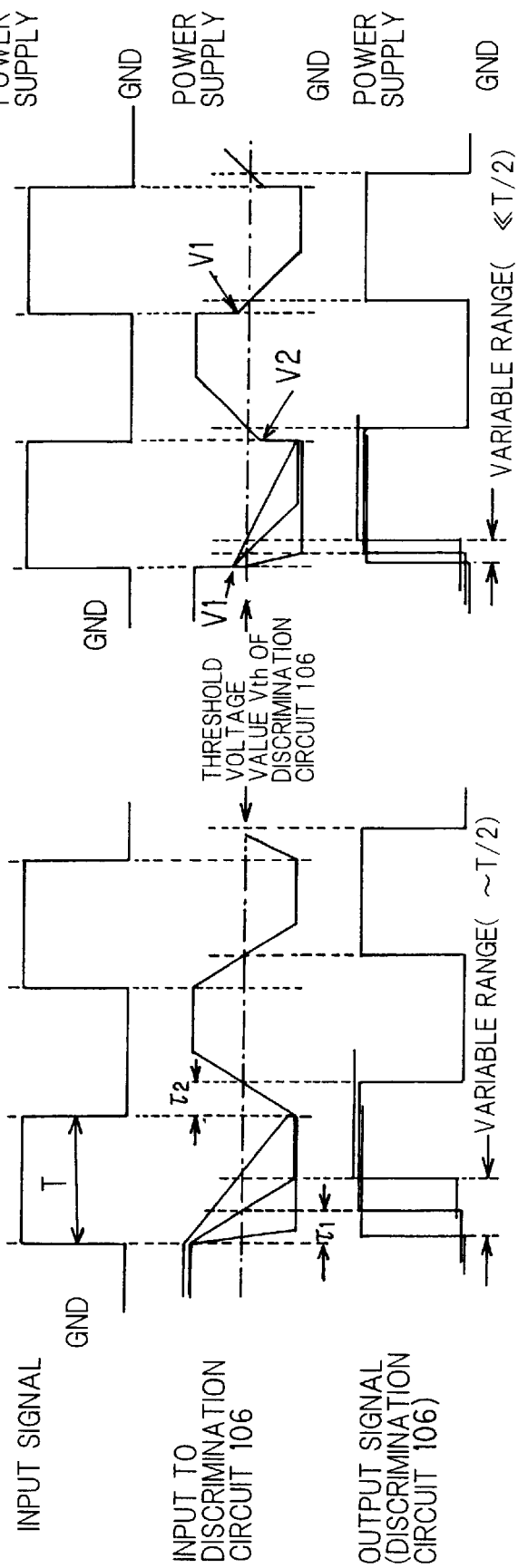
FIGS. 23A, 23B are diagrams useful in describing the operation of a CMOS pulse delay circuit according to the prior art.
Figure 24A:
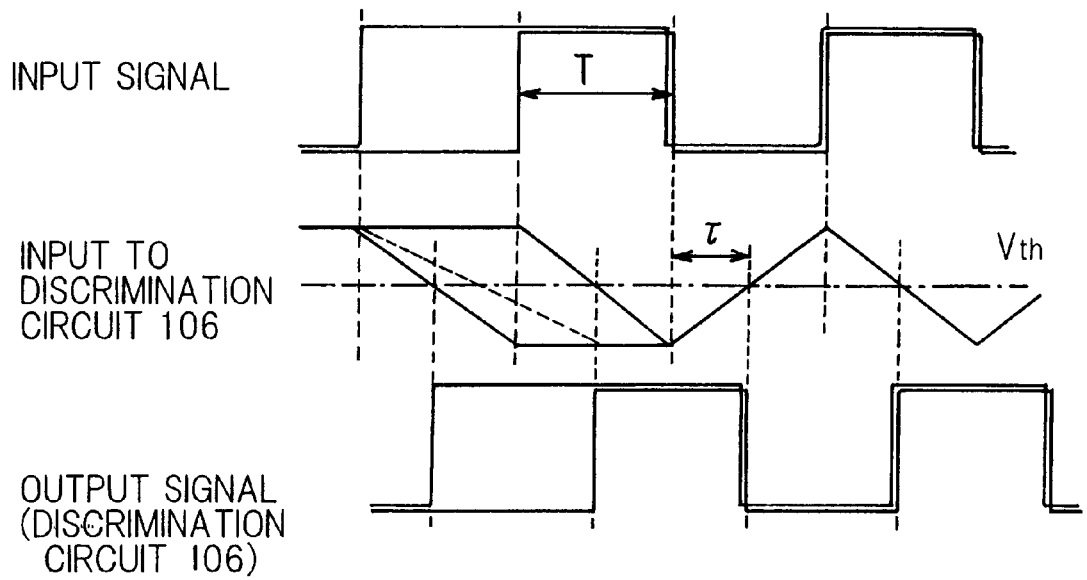
FIGS. 24A, 24B are diagrams useful in describing the reason why the input to a discrimination circuit must make a complete swing.
Figure 24B:
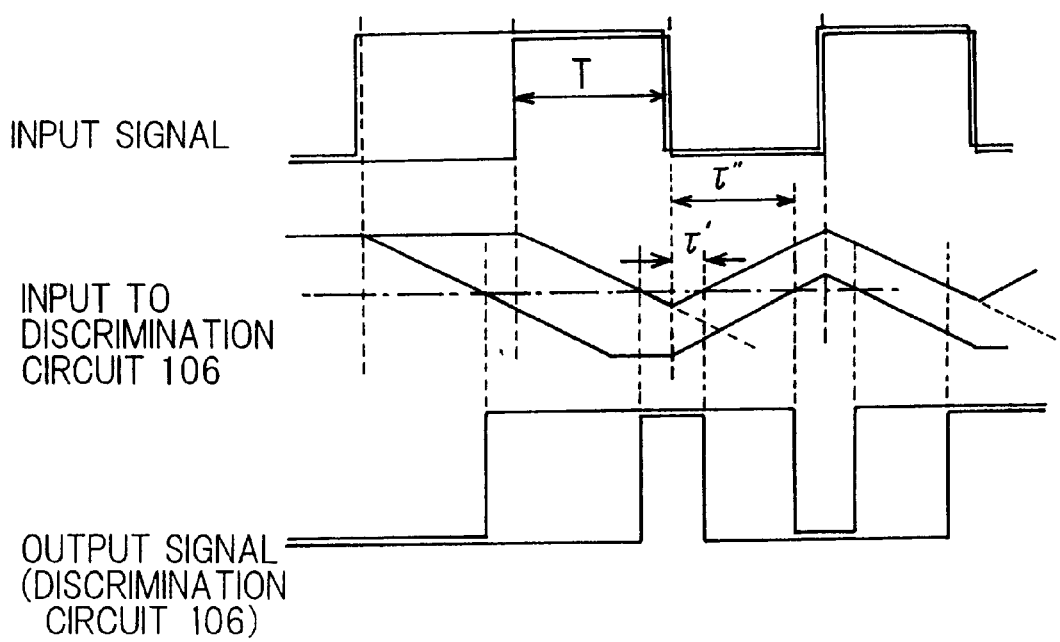

FIG. 21 is a diagram showing the construction of a second embodiment of an oscillator circuit using CMOS delay circuits. The oscillator circuit is constructed by connecting serially, in the form of a ring, an even number of CMOS delay circuits whose input and output signal levels are not the inverse of each other, and a single signal-level inverter circuit.

As shown in FIG. 21, an oscillator circuit 53 is constructed by connecting serially, in the form of a ring, two CMOS delay circuits 261, 262 (see the fourth embodiment in FIG. 9) whose input and output signal levels are not the inverse of each other, and one signal-level inverter circuit 51. The current control circuit 55 has a construction identical with that of the current control circuit shown in FIG. 18 and passes the delay control currents 14 into the CMOS delay circuits 261, 262. The current control circuit 55 is capable of controlling, by the control voltage 54, the value of the delay control currents 14 that flow into the CMOS delay circuits 261, 262. As a result, oscillation frequency can be changed by changing the delay time of the CMOS delay circuits. The oscillation frequency f is given by Equation (6) just as in the first embodiment. Since the CMOS delay circuits 261, 262 have a broad range over which delay time can be varied, the range over which the oscillation frequency is variable can be enlarged.

Though the embodiments have been described in regard to use of MOS transistors, the present invention is not limited to MOS transistors but can be applied to other field-effect transistors such as MIS transistors.

Thus, in accordance with the present invention, there is no parasitic capacitance that appears in conjunction with the capacitor of the discrimination circuit when the input signal changes over between the rising and falling states. When the input signal changes over, therefore, the input voltage to the discrimination circuit does not change instantaneously to an intermediate potential and the input voltage of the discrimination circuit can be controlled at a fixed slope from the ground level to the power-supply level or from the power-supply level to the ground level. As a result, according to the present invention, the range over which the delay time is variable can be enlarged and a variance in delay time can be reduced.

Further, in accordance with the present invention, it is possible to provide various delay circuits such as a delay circuit in which there is no change in the pulse width of the input and output signals, a delay circuit for delaying only the rising edge of the input signal, a delay circuit for delaying only the falling edge of the input signal, a delay circuit in which input and output levels are the inverse of each other and a delay circuit in which the input and output levels are not the inverse of each other. As a result, the range over which the delay time is variable can be enlarged and a variance in delay time can be reduced.

Further, in accordance with the present invention, an oscillator circuit is constructed by connecting serially, in the form of a ring, an odd number of delay circuits whose input and output signal levels are the inverse of each other, or by connecting serially, in the form of a ring, an even number of delay circuits whose input and output signal levels are not the inverse of each other and one signal-level inverting circuit. If such an arrangement is adopted, the oscillation frequency can be controlled by varying the delay times of the delay circuits through control of voltage. This makes it possible to realize a voltage-controlled oscillator (VCO). Further, since the delay times of the delay circuits constituting the oscillator circuit can be varied over a broad range, the range over which the oscillation frequency of the VCO is variable can be enlarged.

As many apparently widely different embodiments of the present invention can be made without departing from the spirit and scope thereof, it is to be understood that the invention is not limited to the specific embodiments thereof except as defined in the appended claims.

What is claimed is:

1. A delay circuit for delaying input signal having an inverter in which field-effect transistors of different channels are serially connected, a connection between the transistors is adopted as an output terminal of the inverter and input signals are applied to gates of the field-effect transistors, a capacitor connected to the output terminal of said inverter, and a discrimination circuit for discriminating a signal that appears at the output terminal of said inverter, said delay circuit comprising:

a charging current control circuit connected to the gate of one of the field-effect transistors for controlling, on the basis of an input signal and a first delay time control signal, a charging current that flows into said capacitor; and a discharge current control circuit connected to the gate of the other of the field-effect transistors for controlling, on the basis of the input signal and a second delay time control signal, a discharge current from said capacitor.

2. A delay circuit for delaying at least one of a timing of a rising edge and a timing of a falling edge of an input signal alternating between first and second levels, comprising:

a charge pump in which first and second field-effect transistors of different channels are serially connected;

a capacitor connected in parallel with the first field-effect transistor;

a charging current control circuit for controlling magnitude of a charging current on the basis of one of the rising edge delay time and falling edge delay time and passing the charging current into said capacitor via the second field-effect transistor of said charge pump when the input signal is at the first level;

a discharge current control circuit for controlling magnitude of a discharge current on the basis of the other of the rising edge delay time and falling edge delay time and releasing the discharge current form said capacitor via the first field-effect transistor when the input signal is at the second level; and a discrimination circuit for outputting a signal of a prescribed logic level based upon a terminal voltage of the capacitor.

3. The delay circuit according to claim 2, wherein when the input signal is at the first level, said charging current control circuit performs control in such a manner that the second field-effect transistor serves as a current source for passing the charging current, and when the input signal is at the second level, said charging current control circuit performs control in such a manner that the second field-effect transistor is turned off to make the charging current zero; and when the input signal is at the second level, said discharge current control circuit performs control in such a manner that the first field-effect transistor serves as a current source for passing the discharge current, and when the input signal is at the first level, said discharge current control circuit performs control in such a manner that the first field-effect transistor is turned off to make the discharge current zero.

4. The delay circuit according to claim 3, wherein said discharge current control circuit has a third field-effect transistor for passing a delay control current that conforms to delay time, and said third field-effect transistor and the first field-effect transistor construct a current mirror circuit;

when the input signal is at the second level, the delay control current flows into the third field-effect transistor and a discharge current proportional to the delay control current flows into the first field-effect transistor owing to a current mirror function of the current mirror circuit, and when the input signal is at the first level, no delay control current flows into the third field-effect transistor, thereby making the discharge current zero; and said charging current control circuit has a fourth field-effect transistor for passing a delay control current that conforms to delay time, and said fourth field-effect transistor and the second field-effect transistor construct a current mirror circuit;

when the input signal is at the first level, the delay control current flows into the fourth field-effect transistor and a charging current proportional to the delay control current flows into the second field-effect transistor owing to a current mirror function of the current mirror circuit, and when the input signal is at the second level, no delay control current flows into the fourth field-effect transistor, thereby making the charging current zero.

5. The delay circuit according to claim 4, further comprising;

a delay control current circuit for passing the delay control currents that conform to the delay times through the third and fourth field-effect transistors, respectively.

6. The delay circuit according to claim 2, wherein when the input signal is at the first level, said charging current control circuit performs control in such a manner that the second field-effect transistor serves as a current source for passing the charging current, and when the input signal is at the second level, said charging current control circuit performs control in such a manner that the second field-effect transistor is turned off to make the charging current zero; and said discharge current control circuit controls the first field-effect transistor as a switch to turn this field-effect transistor on and off, turns on the first field-effect transistor to pass the discharge current when the input signal is at the second level, and turns off the first field-effect transistor to make the discharge current zero when the input signal is at the first level.

7. The delay circuit according to claim 6, wherein said charging current control circuit has a fourth field-effect transistor for passing a delay control current that conforms to delay time, and said fourth field-effect transistor and the second field-effect transistor construct a current mirror circuit;

when the input signal is at the first level, the delay control current flows into the fourth field-effect transistor and a charging current proportional to the delay control current flows into the second field-effect transistor owing to a current mirror function of the current mirror circuit, and when the input signal is at the second level, no delay control current flows into the fourth field-effect transistor, thereby making the charging current zero; and said discharge current control circuit has an inverter constructed by field-effect transistors connected to a signal input terminal, the first field-effect transistor being controlled by the output of said inverter to be turned on and off based upon the input signal level.

8. The delay circuit according to claim 2, wherein said charging current control circuit controls the second field-effect transistor as a switch to turn this field-effect transistor on and off, turns on the second field-effect transistor to pass the charging current when the input signal is at the first level, and turns off the second field-effect transistor to make the charging current zero when the input signal is at the second level; and when the input signal is at the second level, said discharge current control circuit performs control in such a manner that the first field-effect transistor serves as a current source for passing the discharge current, and when the input signal is at the first level, said discharge current control circuit performs control in such a manner that the first field-effect transistor is turned off to make the discharge current zero.

9. The delay circuit according to claim 8, wherein said charging current control circuit has an inverter constructed by field-effect transistors connected to a signal input terminal, the second field-effect transistor being controlled by the output of said inverter to be turned on and off based upon the input signal level;

said discharge current control circuit has a third field-effect transistor for passing a delay control current that conforms to delay time, and said third field-effect transistor and the first field-effect transistor construct a current mirror circuit;

when the input signal is at the second level, the delay control current flows into the third field-effect transistor and a discharge current proportional to the delay control current flows into the first field-effect transistor owing to a current mirror function of the current mirror circuit, and when the input signal is at the first level, no delay control current flows into the third field-effect transistor, thereby making the discharge current zero.

10. The delay circuit according to claim 2, wherein said discrimination circuit is constituted by an inverter composed of field-effect transistors.

11. The delay circuit according to claim 2, wherein said capacitor is constituted by input capacitance of said discrimination circuit.

12. The delay circuit according to claim 2, wherein two delay circuits whose input and output signal levels are in inverse relation to each other are serially connected and delay times of the two delay circuits are made equal to each other, thereby equalizing pulse width of the input signal and pulse width of the output signal.

13. The delay circuit according to claim 2, wherein two delay circuits whose input and output signal levels are not in inverse relation to each other are serially connected via a first signal inverting circuit, a second inverting circuit is connected to an output terminal of whichever of the two delay circuits is on an output side, and delay times of the two delay circuits are made the same, thereby equalizing pulse width of the input signal and pulse width of the output signal.

14. The delay circuit according to claim 2, wherein two delay circuits whose input and output signal levels are not in inverse relation to each other are serially connected via a first signal inverting circuit, a second inverting circuit is connected to an input terminal of whichever of the two delay circuits is on an input side, and delay times of the two delay circuits are made the same, thereby equalizing pulse width of the input signal and pulse width of the output signal.

15. An oscillator circuit comprising:

an odd number of delay circuits serially connected into ring form, input and output signal levels of said delay circuits being in inverse relation to each other, each delay circuit comprising:

a charge pump in which first and second field-effect transistors of different channels are serially connected;

a capacitor connected in parallel with the first field-effect transistor;

a charging current control circuit for controlling magnitude of a charging current on the basis of one of the rising edge delay time and falling edge delay time and passing the charging current into said capacitor via the second field-effect transistor of said charge pump when the input signal is at the first level;

a discharge current control circuit for controlling magnitude of a discharge current on the basis of the other of the rising edge delay time and falling edge delay time and releasing the discharge current from said capacitor via the first field-effect transistor when the input signal is at the second level; and a discrimination circuit for outputting a signal of a prescribed logic level based upon a terminal voltage of the capacitor.

16. The oscillator circuit according to claim 15, further comprising a current control circuit for varying signal delay time of said delay circuits by controlling the charging current or the discharging current based upon voltage control and causing oscillation at a frequency conforming to the signal delay time.

17. An oscillator circuit comprising;

an even number of delay circuits serially connected into ring form, input and output signal levels of said delay circuits not being in inverse relation to each other, each delay circuit comprising:

a charge pump in which first and second field-effect transistors of different channels are serially connected;

a capacitor connected in parallel with the first field-effect transistor;

a charging current control circuit for controlling magnitude of a charging current on the basis of one of the rising edge delay time and falling edge delay time and passing the charging current into said capacitor via the second field-effect transistor of said charge pump when the input signal is at the first level;

a discharge current control circuit for controlling magnitude of a discharge current on the basis of the other of the rising edge delay time and falling edge delay time and releasing the discharge current from said capacitor via the first field-effect transistor when the input signal is at the second level; and a discrimination circuit for outputting a signal of a prescribed logic level based upon a terminal voltage of the capacitor.

18. The oscillator circuit according to claim 17, further comprising a current control circuit for varying signal delay time of said delay circuits by controlling the charging current or the discharging current based upon voltage control and causing oscillation at a frequency conforming to the signal delay time.

* * * * *